(12) United States Patent
Welker et al.

(10) Patent No.: US 10,478,668 B2
(45) Date of Patent: Nov. 19, 2019

(54) ACTIVITY MONITORING BASE STATION

(71) Applicant: adidas AG, Herzogenaurach (DE)

(72) Inventors: Michael Welker, Obermichelbach (DE); Arto Nikula, Lumijoki (FI)

(73) Assignee: adidas AG, Herzogenaurach (DE)

( * ) Notice: Subject to any disclaimer, the term of this patent is extended or adjusted under 35 U.S.C. 154(b) by 852 days.

(21) Appl. No.: 14/552,018

(22) Filed: Nov. 24, 2014

(65) Prior Publication Data

US 2016/0144233 A1 May 26, 2016

(51) Int. Cl.
| | | |
|---|---|---|
| *H05K 7/20* | (2006.01) | |
| *A63B 24/00* | (2006.01) | |
| *H05K 5/02* | (2006.01) | |
| *H04B 1/38* | (2015.01) | |
| *H04B 1/3827* | (2015.01) | |
| *H04B 1/036* | (2006.01) | |
| *G06Q 10/06* | (2012.01) | |
| *G06K 9/00* | (2006.01) | |
| *G09B 19/00* | (2006.01) | |
| *H04W 4/80* | (2018.01) | |

(52) U.S. Cl.
CPC ...... *A63B 24/0062* (2013.01); *G06K 9/00342* (2013.01); *G06Q 10/0639* (2013.01); *G09B 19/0038* (2013.01); *H04B 1/036* (2013.01); *H04B 1/38* (2013.01); *H04B 1/385* (2013.01); *H04W 4/80* (2018.02); *H05K 5/0234* (2013.01); *H05K 7/205* (2013.01); *H05K 7/20009* (2013.01); *H04B 2001/3855* (2013.01); *H04B 2001/3861* (2013.01); *H04Q 2209/10* (2013.01)

(58) Field of Classification Search
None
See application file for complete search history.

(56) References Cited

U.S. PATENT DOCUMENTS

| | | |
|---|---|---|
| 2,571,442 A | 10/1951 | Griffith |
| 3,307,546 A | 3/1967 | Cherio et al. |
| 3,534,727 A | 10/1970 | Roman |
| 3,874,368 A | 4/1975 | Asrican |
| 3,926,177 A | 12/1975 | Hardway, Jr. et al. |

(Continued)

FOREIGN PATENT DOCUMENTS

| | | |
|---|---|---|
| CN | 1832677 A | 9/2006 |
| CN | 103179692 A | 6/2013 |

(Continued)

OTHER PUBLICATIONS

Communication Pursuant to Article 94(3) EPC issued in European Patent Application No. EP 15195592.9 dated Mar. 17, 2017.

(Continued)

Primary Examiner — Courtney L Smith
(74) Attorney, Agent, or Firm — Sterne, Kessler, Goldstein & Fox P.L.L.C.

(57) ABSTRACT

A base station for an activity monitoring system that facilitates live monitoring of a plurality of individuals. The base station may include a ventilation channel and a heat sink for cooling a control module disposed within the base station. The base station may be water resistant so as to protect the control module from water damage. The base station may also have an egg-shape for facilitating the drainage of water off the base station and to reduce the force of an impact on the base station.

33 Claims, 22 Drawing Sheets

(56) References Cited

U.S. PATENT DOCUMENTS

| | | | |
|---|---|---|---|
| 4,016,868 A | 4/1977 | Allison |
| 4,033,332 A | 7/1977 | Hardway, Jr. et al. |
| 4,102,331 A | 7/1978 | Grayzel et al. |
| 4,202,350 A | 5/1980 | Walton |
| 4,289,142 A | 9/1981 | Kearns |
| 4,308,872 A | 1/1982 | Watson et al. |
| 4,312,358 A | 1/1982 | Barney |
| 4,373,534 A | 2/1983 | Watson |
| 4,387,722 A | 6/1983 | Kearns |
| 4,494,553 A | 1/1985 | Sciarra et al. |
| 4,572,197 A | 2/1986 | Moore et al. |
| 4,580,572 A | 4/1986 | Granek et al. |
| 4,753,088 A | 6/1988 | Harrison et al. |
| 4,777,962 A | 10/1988 | Watson et al. |
| 4,815,473 A | 3/1989 | Watson et al. |
| 4,817,625 A | 4/1989 | Miles |
| 4,889,131 A | 12/1989 | Salem et al. |
| 4,909,260 A | 3/1990 | Salem et al. |
| 4,962,469 A | 10/1990 | Ono et al. |
| 5,007,427 A | 4/1991 | Suzuki et al. |
| 5,074,129 A | 12/1991 | Matthew |
| 5,076,801 A | 12/1991 | Schroll |
| 5,099,855 A | 3/1992 | Yount |
| 5,111,818 A | 5/1992 | Suzuki et al. |
| 5,143,089 A | 9/1992 | Alt |
| 5,148,002 A | 9/1992 | Kuo et al. |
| 5,153,584 A | 10/1992 | Engira |
| 5,204,670 A | 4/1993 | Stinton |
| 5,210,540 A | 5/1993 | Masumoto |
| 5,241,300 A | 8/1993 | Buschmann |
| 5,295,490 A | 3/1994 | Dodakian |
| 5,329,932 A | 7/1994 | Yount |
| 5,348,008 A | 9/1994 | Bornn et al. |
| 5,353,793 A | 10/1994 | Bornn |
| 5,400,254 A | 3/1995 | Fujita |
| 5,416,961 A | 5/1995 | Vinay |
| 5,428,546 A | 6/1995 | Shah et al. |
| 5,454,376 A | 10/1995 | Stephens et al. |
| 5,583,776 A | 12/1996 | Levi et al. |
| 5,611,085 A | 3/1997 | Rasmussen |
| 5,724,025 A | 3/1998 | Tavori |
| 5,758,313 A | 5/1998 | Shah et al. |
| 5,769,755 A | 6/1998 | Henry et al. |
| 5,782,778 A | 7/1998 | De Briere et al. |
| 5,820,567 A | 10/1998 | Mackie |
| 5,862,511 A | 1/1999 | Croyle et al. |
| 5,907,291 A | 5/1999 | Chen et al. |
| 5,934,079 A | 8/1999 | Han et al. |
| 5,937,854 A | 8/1999 | Stenzler |
| 5,991,922 A | 11/1999 | Banks |
| 6,002,982 A | 12/1999 | Fry |
| 6,047,203 A | 4/2000 | Sackner et al. |
| 6,066,093 A | 5/2000 | Kelly et al. |
| 6,145,551 A | 11/2000 | Jayararrian et al. |
| 6,148,262 A | 11/2000 | Fry |
| 6,175,494 B1 | 1/2001 | Komatsu |
| 6,179,786 B1 | 1/2001 | Young |
| 6,198,394 B1 | 3/2001 | Jacobsen et al. |
| 6,246,362 B1 | 6/2001 | Tsubata et al. |
| 6,253,452 B1 | 7/2001 | Chen et al. |
| 6,254,551 B1 | 7/2001 | Varis |
| 6,266,623 B1 | 7/2001 | Vock et al. |
| 6,287,264 B1 | 9/2001 | Hoffman |
| 6,306,088 B1 | 10/2001 | Krausman et al. |
| 6,341,504 B1 | 1/2002 | Istook |
| 6,381,482 B1 | 4/2002 | Jayaraman et al. |
| 6,419,636 B1 | 7/2002 | Young et al. |
| 6,424,295 B1 | 7/2002 | Lange |
| 6,443,890 B1 | 9/2002 | Schulze et al. |
| 6,461,307 B1 | 10/2002 | Kristbjarnarson et al. |
| 6,463,385 B1 | 10/2002 | Fry |
| 6,478,736 B1 | 11/2002 | Mault |
| 6,513,532 B2 | 2/2003 | Mault et al. |
| 6,529,827 B1 | 3/2003 | Beason et al. |
| 6,551,252 B2 | 4/2003 | Sackner et al. |
| 6,579,231 B1 | 6/2003 | Phipps |
| 6,616,613 B1 | 9/2003 | Goodman |
| 6,687,523 B1 | 2/2004 | Jayaramen et al. |
| 6,778,389 B1* | 8/2004 | Glovatsky ............ H01L 25/065 165/80.1 |
| 6,790,178 B1 | 9/2004 | Mault et al. |
| 6,798,378 B1 | 9/2004 | Walters |
| 6,941,775 B2 | 9/2005 | Sharma |
| 6,970,731 B1 | 11/2005 | Jayaraman et al. |
| 7,254,516 B2 | 8/2007 | Case, Jr. et al. |
| 7,453,693 B2* | 11/2008 | Tomino ................ H05K 5/0204 165/185 |
| 7,559,902 B2 | 7/2009 | Ting et al. |
| 7,604,603 B2 | 10/2009 | Sackner et al. |
| 7,670,263 B2 | 3/2010 | Ellis et al. |
| 7,670,295 B2 | 3/2010 | Sackner et al. |
| 7,715,982 B2 | 5/2010 | Grenfell et al. |
| 8,033,959 B2 | 10/2011 | Oleson et al. |
| 8,105,208 B2 | 1/2012 | Oleson et al. |
| 8,200,323 B2 | 6/2012 | DiBenedetto et al. |
| 8,241,184 B2 | 8/2012 | DiBenedetto et al. |
| 8,422,232 B2* | 4/2013 | Kwak ..................... H01Q 1/02 343/872 |
| 8,681,501 B2* | 3/2014 | Govindasamy ......... G06F 1/203 174/16.3 |
| 8,818,478 B2 | 8/2014 | Scheffler et al. |
| 2002/0032386 A1 | 3/2002 | Sackner et al. |
| 2004/0010420 A1 | 1/2004 | Rooks |
| 2004/0176674 A1 | 9/2004 | Nazeri |
| 2004/0212545 A1 | 10/2004 | Li et al. |
| 2005/0054941 A1 | 3/2005 | Ting et al. |
| 2005/0073283 A1 | 4/2005 | Friedli et al. |
| 2006/0074338 A1 | 4/2006 | Greenwald et al. |
| 2006/0082973 A1* | 4/2006 | Egbert ............... H05K 7/20154 361/709 |
| 2006/0143645 A1 | 6/2006 | Vock et al. |
| 2007/0191083 A1 | 8/2007 | Kuenzler et al. |
| 2007/0219059 A1 | 9/2007 | Schwartz et al. |
| 2007/0240190 A1 | 10/2007 | Arseneau et al. |
| 2008/0015454 A1 | 1/2008 | Gal |
| 2008/0219319 A1 | 9/2008 | Buckalew |
| 2010/0002383 A1* | 1/2010 | Yeh ........................ G06F 1/181 361/695 |
| 2010/0184563 A1 | 7/2010 | Molyneaux et al. |
| 2010/0184564 A1 | 7/2010 | Molyneaux et al. |
| 2010/0274100 A1 | 10/2010 | Behar et al. |
| 2011/0054270 A1 | 3/2011 | Derchak |
| 2011/0054271 A1 | 3/2011 | Derchak et al. |
| 2011/0054272 A1 | 3/2011 | Derchak |
| 2011/0054289 A1 | 3/2011 | Derchak et al. |
| 2011/0054290 A1 | 3/2011 | Derchak |
| 2011/0087115 A1 | 4/2011 | Sackner et al. |
| 2011/0105861 A1 | 5/2011 | Derchak et al. |
| 2011/0130643 A1 | 6/2011 | Derchak et al. |
| 2011/0181419 A1 | 7/2011 | Mack et al. |
| 2011/0304497 A1 | 12/2011 | Molyneux et al. |
| 2012/0046792 A1* | 2/2012 | Secor ................... F24F 11/0086 700/276 |
| 2012/0095352 A1* | 4/2012 | Tran ..................... A61B 5/0022 600/490 |
| 2012/0095356 A1 | 4/2012 | Oleson et al. |
| 2012/0235821 A1 | 9/2012 | DiBenedetto et al. |
| 2012/0244995 A1 | 9/2012 | DiBenedetto et al. |
| 2012/0246795 A1 | 10/2012 | Scheffler et al. |
| 2012/0253484 A1 | 10/2012 | Burich et al. |
| 2012/0254934 A1 | 10/2012 | Mcbrearty et al. |
| 2012/0274469 A1 | 11/2012 | Oleson et al. |
| 2013/0041590 A1 | 2/2013 | Burich et al. |
| 2014/0245783 A1* | 9/2014 | Proud .................. A44C 5/0015 63/1.11 |
| 2014/0362523 A1* | 12/2014 | Degner ..................... G06F 3/00 361/679.47 |

(56) References Cited

U.S. PATENT DOCUMENTS

| | | | | |
|---|---|---|---|---|
| 2014/0362576 A1* | 12/2014 | Degner | ............... | G06F 3/00 362/253 |
| 2015/0028996 A1* | 1/2015 | Agrafioti | ............ | G06F 21/40 340/5.82 |
| 2015/0040282 A1* | 2/2015 | Longinotti-Buitoni | ............... | A61B 5/6804 2/69 |

FOREIGN PATENT DOCUMENTS

| | | | |
|---|---|---|---|
| CN | 203909691 | U | 10/2014 |
| EP | 0 098 587 | | 1/1984 |
| EP | 1 134 555 | A1 | 9/2001 |
| EP | 1 701 604 | A1 | 9/2006 |
| EP | 2 108 311 | A1 | 10/2009 |
| GB | 2 259 772 | | 3/1993 |
| JP | 11-261265 | | 9/1999 |
| JP | 2013-229498 | | 11/2013 |
| WO | WO 99/30613 | | 6/1999 |
| WO | WO 2002/067449 | A2 | 8/2002 |
| WO | WO 2006/058341 | A2 | 6/2006 |
| WO | WO 2014/197735 | A1 | 12/2014 |

OTHER PUBLICATIONS

"Kaufe deinen Mac Pro", Apple Store (Deutschland), http://store.apple.com/de/buy-mac/mac-pro, Accessed Jul. 9, 2015.
Revised Petition to Institute Derivation Proceeding referencing U.S. Appl. No. 13/077,494, filed in Case No. DER2014-00002 with the Patent Trial and Appeal Board on Nov. 21, 2013.
European Search Report for European Application No. 12 16 2813, European Patent Office, Munich, dated Sep. 24, 2012, 4 pages.
European Search Report for European Application No. 13175499.6 European Patent Office, Munich, Germany, dated Jan. 5, 2015, 7 pages.
GPS II: Owner's Manual & Reference ("Garmin"), © 1996 GARMIN Corporation.
U.S. Appl. No. 11/357,772, inventors Sackner et al., filed Feb. 17, 2006.
U.S. Appl. No. 11/373,822, inventors Sackner et al., filed Mar. 9, 2006.
Extended European Search Report for European Application No. 15195592.9-1855, European Patent Office, Munich, Germany, dated Mar. 3, 2016, 20 pages.

\* cited by examiner

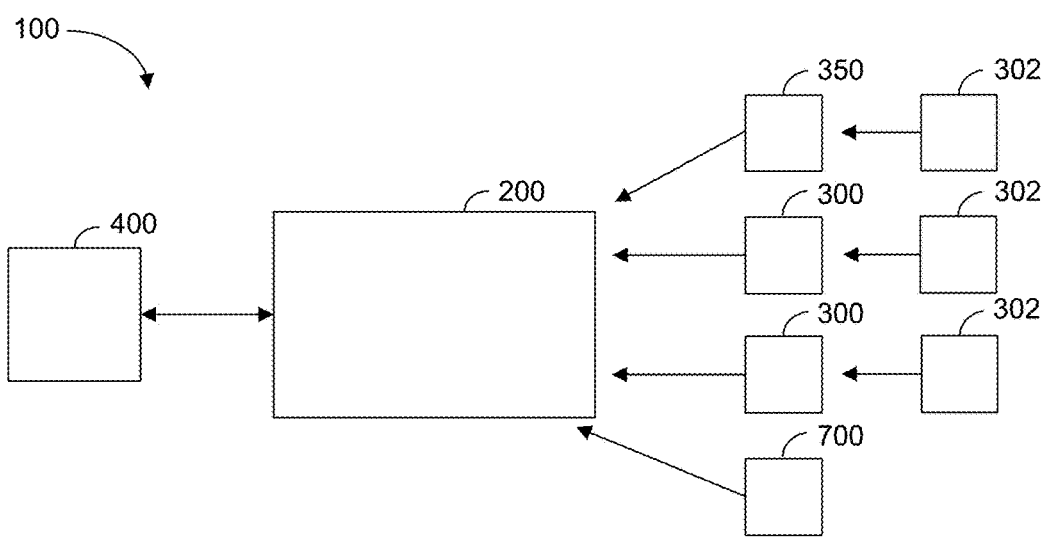
FIG. 11
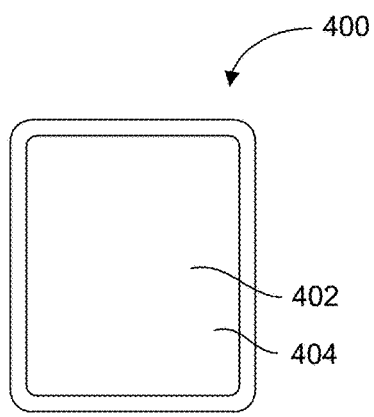 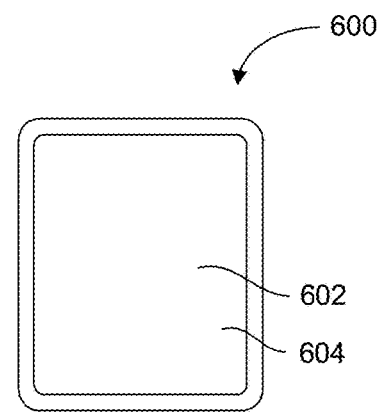
FIG. 12  FIG. 13

ACTIVITY MONITORING BASE STATION

BACKGROUND OF THE INVENTION

Field of the Invention

The present invention generally relates to an activity monitoring system. In particular, embodiments of the present invention relate to a base station for an activity monitoring system that facilitates live monitoring of a plurality of individuals.

Background

Exercise is important to maintaining a healthy lifestyle and individual well-being. A common way for individuals to exercise is to participate in athletic activities, such as, for example, sports and training programs. A session of athletic activity may include, for example, a training session or a competitive session such as, for example, a soccer match or basketball game. When participating in athletic activities in a competitive or collaborative environment, one's performance may be dependent on the performance of other individuals. For example, in a team sport context, the performance of various athletic movements and endeavors may be influenced by the athletic movements and endeavors of teammates or adversaries. Often, a trainer (e.g., a coach) is monitoring such athletic activity.

To effectively monitor the athletic activity, the trainer, or other individual, typically gathers information about the participants in the athletic activity by viewing the athletic activity from, for example, the sidelines of a sports field. Thus, the information used to make decisions that influence the athletic activity is typically limited by what is observed by the trainer from the sidelines. A trainer may have assistants to help with this observation, or multiple trainers may work together, however there remains difficulty in monitoring a plurality of individuals so as to effectively track and manage performance of individuals during an athletic activity.

BRIEF SUMMARY OF THE INVENTION

Some embodiments are directed towards a device for monitoring a plurality of individuals including a base station in communication with a plurality of sensors worn by the plurality of individuals during a fitness activity, the base station including a housing having a ventilation channel extending through the housing, a control module for monitoring a plurality of individuals disposed within the housing, and a heat sink disposed within the ventilation channel.

In some embodiments, the heat sink includes a plurality of fins. In some embodiments, the fins are disposed radially about a center of the ventilation channel. In some embodiments, the fins are coupled to a side wall of the ventilation channel and extend towards a center of the ventilation channel. In some embodiments, the heat sink is in direct contact with the control module.

In some embodiments, a portion of the ventilation channel is defined by a wall of the control module. In some embodiments, the ventilation channel includes a top opening located at a proximal end of the housing and a bottom opening located a distal end of the housing and the ventilation channel extends from the proximal end of the housing, through the control module, to the distal end of the housing.

In some embodiments, the heat sink defines a central aperture configured to receive at least one of a portion of a stand and a portion of an antenna. In some embodiments, the antenna is removable and the removable antenna includes a first connector and the stand includes a second connector, and the central aperture is configured to removably receive a portion of the first connector and the second connector.

In some embodiments, the heat sink comprises a first part and a second part, where the first part is disposed within the ventilation channel and the second part defines a portion of an outer surface of the housing. In some embodiments, the first part is thermally coupled to the second part.

In some embodiments, the housing comprises cover and a base, and the cover and the base define a portion of the ventilation channel. In some embodiments, the control module is disposed between the cover and the base. In some embodiments, the cover and the base are removably attached.

In some embodiments, the base station includes an antenna. In some embodiments, the antenna is removably attached to the base station. In some embodiments, the base station includes a stand. In some embodiments, the stand is removably attached to the base station.

Some embodiments are directed towards a monitoring system for monitoring a plurality of individuals including a plurality of individual sensors worn by the plurality of individuals during a fitness activity and a base station. The base station may include a housing having a ventilation channel extending through the housing, a control module for monitoring the plurality of individuals disposed within the housing configured to receive information from and transmit information to the plurality of individual sensors, and a heat sink disposed within the ventilation channel.

Some embodiments are directed towards a base station for monitoring a plurality of individuals having a housing including a cover coupled to a base, the cover including an inner circumferential wall, an outer circumferential wall, and a circumferential peak connecting the inner circumferential wall and the outer circumferential wall, wherein the inner circumferential wall defines at least a portion of the ventilation channel and the circumferential peak defines a top opening of the ventilation channel. The base station also having a control module for monitoring a plurality of individuals disposed within the housing and a heat sink disposed within the ventilation channel.

In some embodiments, at least a portion of the inner circumferential wall and the outer circumferential wall have a slope in the range between 1° and 89° measured relative to the circumferential peak and in direction orthogonal to the top opening of the ventilation channel. In some embodiments, at least a portion of the inner circumferential wall and the outer circumferential wall have a slope in the range between 1° and 45° measured relative to the circumferential peak and in a direction orthogonal to the top opening of the ventilation channel. In some embodiments, the inner circumferential wall has a non-constant slope measured relative to the circumferential peak and in direction orthogonal to the top opening of the ventilation channel. In some embodiments, the outer circumferential wall has a non-constant slope measured relative to the circumferential peak and in direction orthogonal to the top opening of the ventilation channel.

In some embodiments, the base station is portable. In some embodiments, the housing is water resistant.

In some embodiments, the heat sink comprises a first part and a second part, where the first part is disposed within the ventilation channel and the second part defines a portion of the base of the house. In some embodiments, the second part is the base of the housing.

In some embodiments, the housing has an egg-shape.

In some embodiments, the cover is removably coupled to the base.

In some embodiments, the ventilation channel is a through hole extending from a proximal end of the housing to a distal end of the housing to allow the ventilation of air through the housing. In some embodiments, the ventilation channel includes a top opening located at a proximal end of the housing and a bottom opening located a distal end of the housing, and the ventilation channel extends from the proximal end of the housing, through the control module, to the distal end of the housing.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention. In the drawings, like reference numbers, letters, or renderings indicate identical or functionally similar elements.

FIG. 11 shows a diagram of a monitoring system according to an embodiment.

FIG. 12 shows a group monitoring device according to an embodiment.

FIG. 13 shows an analysis device according to an embodiment.

DETAILED DESCRIPTION OF THE INVENTION

Figure 1:
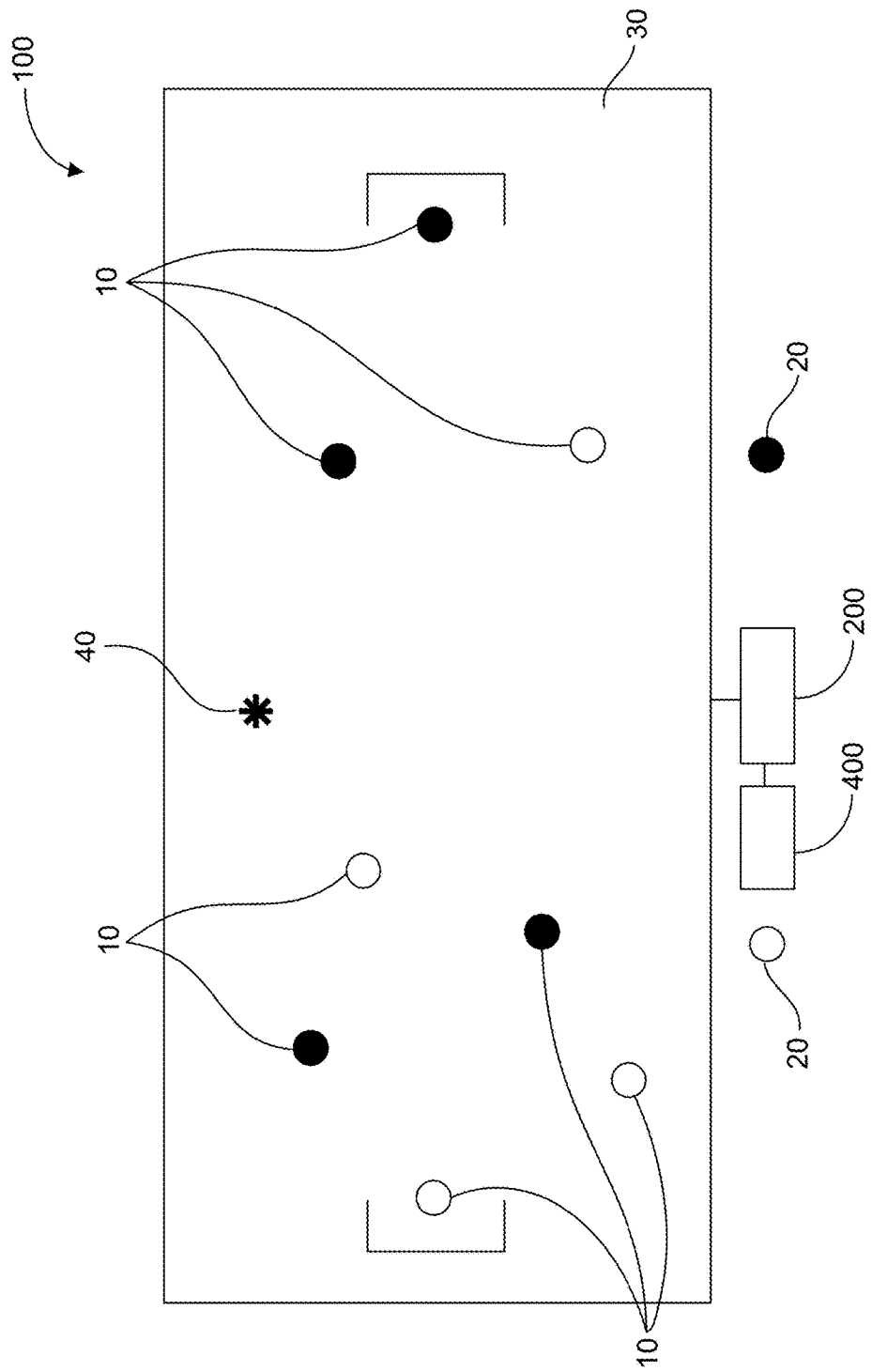
FIG. 1 shows a monitoring system according to an embodiment.

The present invention will now be described in detail with reference to embodiments thereof as illustrated in the accompanying drawings. References to "one embodiment", "an embodiment", "an exemplary embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The term "invention" or "present invention" as used herein is a non-limiting term and is not intended to refer to any single embodiment of the particular invention but encompasses all possible embodiments as described in the application.

Various aspects of the present invention, or any parts or functions thereof, may be implemented using hardware, software, firmware, tangible computer readable or computer usable storage media having instructions stored thereon, or a combination thereof, and may be implemented in one or more computer systems or other processing systems.

Individuals participating in an athletic activity and trainers (e.g., a coach, physician, or other authorized individual) may work together during a session of athletic activity for a variety of reasons. For example, it may be desired that the trainer monitors the performance of the individuals and makes recommendations or otherwise influences their performance in order to maximize the individuals' fitness level. Alternatively or additionally, it may be desired that the trainer monitors and influences the individuals to help maximize the effectiveness of the individuals in the athletic activity. Further, it may be desired that the trainer monitors and influences the individuals to help maximize the probability of success in the athletic activity (where success may be, for example, defeating an opposing team in a game, such as, for example, soccer, or achieving/maintaining a desired level of fitness for one or more individuals participating in the athletic activity). A session of athletic activity may include, for example, a training session (e.g., a field session, a gym session, a track session) or a competitive session (e.g., a soccer match or a basketball game)

In some embodiments, the trainer may monitor and influence the individuals in order to track and maintain the individuals' health and safety. In such an embodiment, it may be beneficial for the trainer to be provided with information relating to health and safety, for example, injuries, illnesses, and dangerous conditions.

The trainer must consider these and other goals, monitor the individuals, and make decisions to influence the performance of the individuals both individually and as a group. In doing so, the trainer depends on information about the individuals and their performance while participating in a session of athletic activity. The trainer may benefit from receipt of information in addition to that which is directly observable by the trainer. A group monitoring system according to an embodiment of the present invention can provide the trainer with easy-to-understand information about individuals participating in the athletic activity, beyond that which can be directly observed, thereby facilitating quick and effective decision-making by the trainer to maximize the probability of achieving success in the athletic activity. Detailed player profiles with performance metrics over time can be generated and maintained. By using information provided by the group monitoring system, trainers can view trends over time, which can help identify, for example, unfit athletes, athletes who are over-training, and athletes having relatively high risk for injury. Special training programs can be planned to address these conditions enabling peak performance (e.g., at game time).

conventionally, a trainer would plan a session of athletic activity hoping to deliver a certain workload (e.g., represented by target values for one or more metrics) to a team or to particular individuals or subsets thereof, but would not have a reliable way to measure if the intended workload was actually delivered. With a group monitoring system according to embodiments of the present invention, a trainer now can determine whether the intended workload was actually delivered (e.g., by direct measurement of one or more metrics indicating or providing the basis for a determination of total workload). This enables the trainer to more precisely plan and adapt sessions of athletic activity by basing such planning and adapting on measured values representing individual or team performance. Such a group monitoring system may provide feedback that the trainer can act on to revise training as needed. In an exemplary embodiment, the group monitoring system can provide alerts to the trainer to flag critical or important conditions that the trainer would not otherwise be able to observe directly, such as, for example, fatigue of an individual or heart rate of an individual being above a threshold value.

In some embodiments, the group monitoring system of the present invention may include a base station system for collecting information related to an individual's performance and transmit that information to a trainer. In some embodiments, the base station system may also process the information to provide specific information (e.g., metrics) to a trainer associated with an individual. The base station system may be lightweight and portable. A lightweight and portable base station makes it easy for a trainer to transport the base station system to various locations for monitoring different activities and/or individuals. In some embodiments, the base station system may include removably attached parts (e.g., a stand or an antenna) to facilitate the portability of the base station system.

In some embodiments, the base station system may include a water resistant base station for housing one or more electronic components of a control module for collecting and transmitting information related to an individual's athletic performance. Water resistance may be preferred in situations where the base station system is used primarily outside (e.g., to monitor individuals participating in a soccer practice or soccer match). In some embodiments, the base station may include an egg-shaped housing for preventing the accumulation of water and allowing water to drain off the base station. The egg-shape may also reduce the force of an impact (e.g., the impact caused by accidently dropping the base station or the impact caused by a sports object (e.g., soccer ball) hitting the base station during a game or training session) due to the round curvature of the base station's side walls.

In some embodiments, the base station system may include a base station having a ventilation channel including a heat sink at least partially disposed within the ventilation channel. The heat sink may facilitate the conduction of heat way from a control module housed within the base station to prevent overheating of the control module. In such embodiments, the ventilation channel allows air to flow through the base station and over the heat sink, thereby increasing the heat sink's ability to conduct heat away from the control module. The heat sink may include no moving parts, which may prevent potential maintenance costs associated with the base station and may reduce the amount of noise that may potentially be created by the base station. Additionally, the ventilation channel may facilitate the draining of water off the base station.

Figure 4:
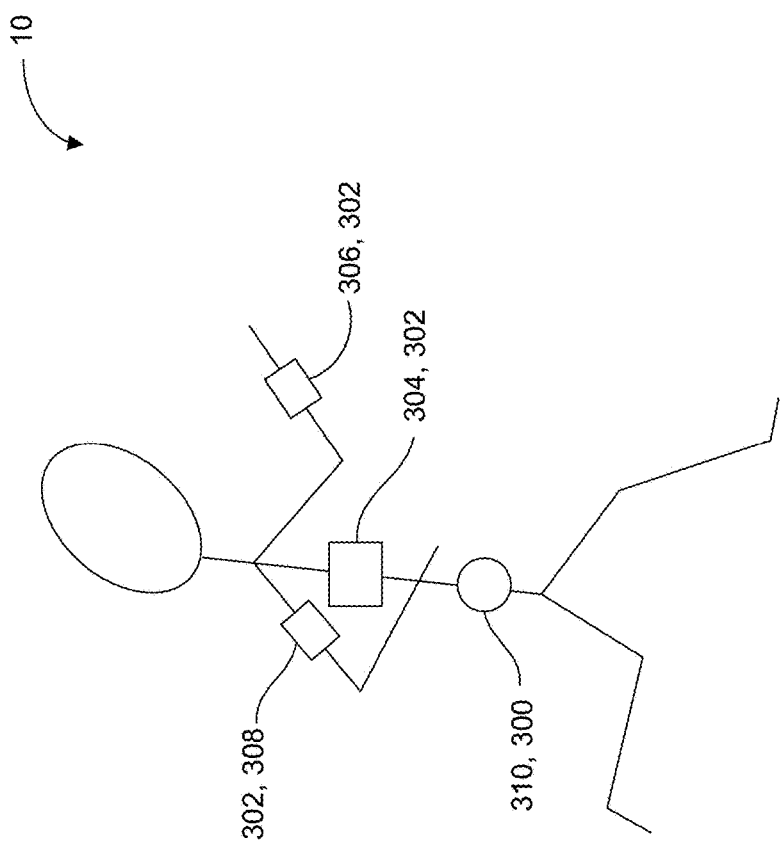
FIG. 4 shows an individual monitor and associated components according to an embodiment.
Figure 5:
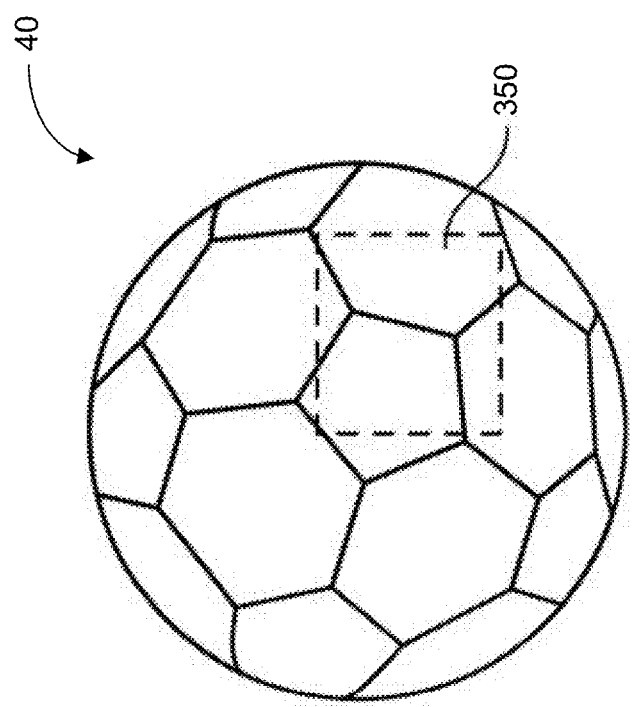
FIG. 5 shows an object monitor according to an embodiment.

FIG. 1 shows a group monitoring system 100 according to an embodiment. Group monitoring system 100 includes a base station system 200 for collecting, processing, and transmitting information, such as athletic information related to an individual's 10 athletic performance. Group monitoring system 100 may also include one or more individual monitors 300, object monitors 350, and group monitoring devices 400. An individual monitor 300 may be coupled to an individual 10, as shown in FIG. 4, and may collect information related to an individual's 10 athletic performance. An object monitor 350 may be coupled to a sports object 40, as shown in FIG. 5, and may collect information related to the location and/or movement of sports object 40.

Figure 2:
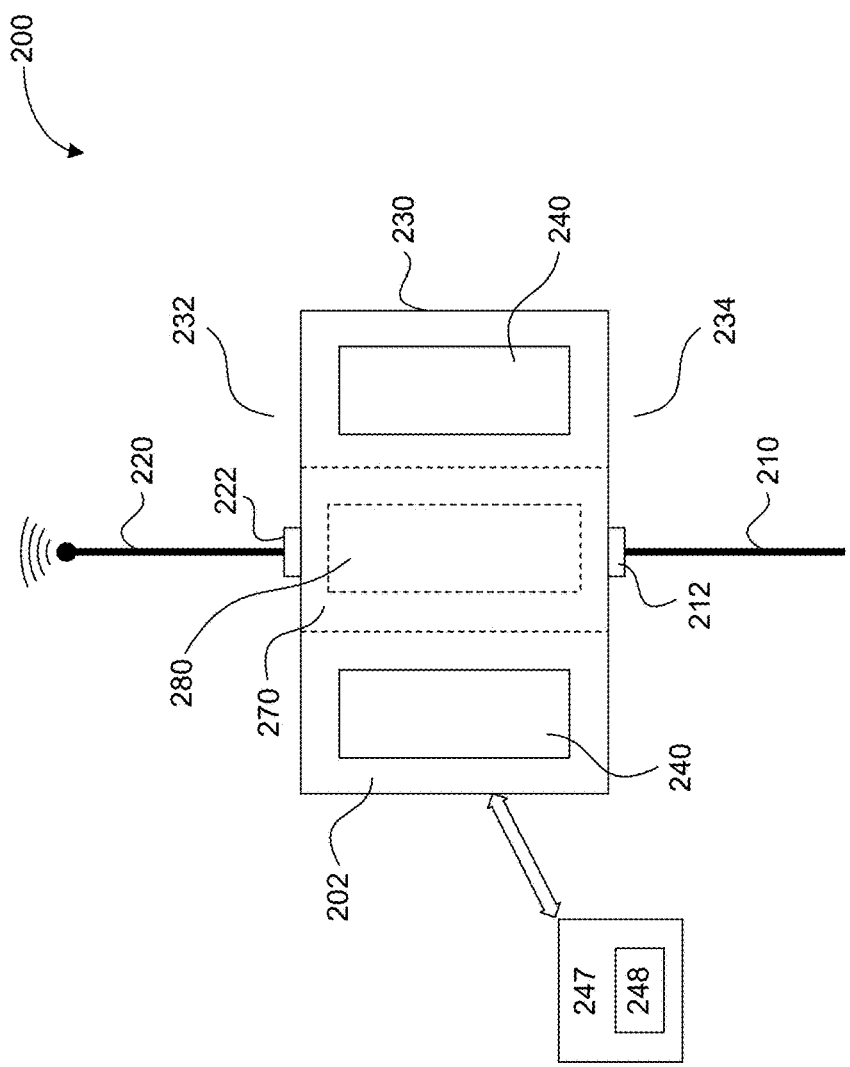
FIG. 2 shows a base station system according to an embodiment.

FIG. 2 shows a base station system 200 according to an embodiment. As shown in FIG. 2, base station system 200 may include a base station 202, a stand 210, and an antenna 220. In some embodiments, stand 210 and/or antenna 220 may be removably attached to base station 202. In some embodiments, stand 210 and/or antenna may be an integral part of base station 202. In some embodiments, stand 210 and/or antenna 220 may be foldable or may telescopically extend from and retract into base station 202. Antenna 220 may wirelessly receive and transmit information to and from one or more external devices (e.g., individual monitors 300, object monitors 350, group monitoring devices 400, analysis devices 600, camera monitoring systems 700, and/or video feed systems 800) (see e.g., FIG. 10). The information received from and/or transmitted to these devices and the function of these devices is described below in more detail. In one embodiment, base station 202 may be provided without antenna 220. Stand 210 may include any suitable support structure for supporting base station 202, including, but not limited to, a tri-pod, a plurality of legs, a pedestal, or an attachment mechanism for attaching base station 202 to, for example, a table, a wall, a mounting device, a rack, or a cart. In some embodiments, the support structure may include an attachment mechanism for suspending base station 202 from a ceiling.

In embodiments including a removable stand 210 and/or antenna 220, Stand 210 and antenna 220 may be removably attached to base station 202 via connectors 212 and 222, respectively. Connectors 212 and 222 may include any type of releasable fastening mechanism for securing stand 210 and antenna 220 to base station 202. Connectors 212 and 222 may be, but are not limited to, luer-lock connectors, friction-fit connectors, threaded connectors, snap-fit connectors, or a combination thereof. In some embodiments, base station 202 may have an internal antenna for receiving and transmitting information to and from external devices. In such embodiments, antenna 220 may be an optional component that may serve to boost the incoming and outgoing wireless signals received by and sent from base station 202.

Base station 202 may include a housing 230 for holding and protecting a control module 240. Control module 240 may control at least one function performed by base station 202, including, but not limited to, the receipt and transmission of information, the processing of information, charging/syncing of individual monitors, etc. In some embodiments, control module 240 may control all functions performed by base station 202. A detailed discussion of some of the functions of base station 202 is presented below. Housing 230 may include a ventilation channel 270 for cooling control module 240. In some embodiments, ventilation channel 270 may be a through hole extending from a proximal end 232 of housing 230 to a distal end 234 of housing to allow air to flow though base station 202. In some embodiments, housing 230 may include a heat sink 280 for dissipating heat generated by control module 240. In some embodiments, at least a portion of heat sink 280 may be disposed in ventilation channel 270. Heat sink 280 may be made of a material having high thermal conductivity, including, but not limited to aluminum, aluminum alloys, copper, and copper alloys. In embodiments including a ventilation channel 270 and a heat sink 280, the flow of air through ventilation channel 270 in combination with heat sink 280 may work collectively to cool control module 240 and/or other components of bases station system 200.

In some embodiments, housing 230 is water resistant or waterproof, and all openings (e.g., external connection points between various parts of base station 202, data/power ports on base station 202, and display 941 and/or user input(s) 942 on base station 202) are sealed. Such water resistance can be achieved by a close fit between external connection points of base station 202, by use of a water resistant sealing compound, by use of sealing members, by other techniques, or by any combination thereof. Ventilation channel 270 may allow water to pass though housing 230, but any connection points (e.g., to control module 240 or other sensors) associated with ventilation channel 270 may be sealed. In some embodiments, the shape of housing 230 and/or ventilation channel 270 may facilitate the funneling of water through ventilation channel 270. The funneling of water though ventilation channel 270 may keep water from collecting (i.e., accumulating) on base station 202, especially near external connection points that may be most vulnerable to water leakage.

In some embodiments, housing 230 may be egg-shaped (see e.g., housing 930 shown in FIGS. 14-15 and 18-19). The egg-shape may reduce the force of impact on housing 230 when housing 230 is hit by a stay sports object 40 or when housing 230 is dropped. As used herein the term "egg-shape" or "egg-shaped" means a three-dimensional object having an external shape that is generally the shape of an ovoid. "Egg-shape" includes a three-dimensional object having an external shape that is approximately half of each of a prolate (long) and a roughly spherical (potentially even slightly oblate/short) ellipsoid joined at the equator, sharing a principal axis of rotational symmetry. The external shape may have recesses or openings disposed thereon (e.g., a ventilation channel). Housing 230 may be any color. In some embodiments, cover 230 may be white so as to reflect light and minimize the amount of heat created by the sun shining on housing 230.

A water resistant housing facilities the use of base station 202 outdoors while minimizing any risk of water damage to control module 240. Also, ventilation channel 270 and/or heat sink 280 may protect control module 240 from overheating that may damage control module 240, which may be particularly likely on hot days. Additionally, ventilation channel 270 and/or heat sink 280 may include no moving parts. The lack of moving parts reduces potential maintenance costs associated with base station 202 and reduces the amount of noise that may potentially be created by base station 202.

Base station system 200 may be a self-contained portable system containing all hardware required or desired to perform the functions of base station system 200. In some embodiments, base station 202 weighs less than about 7 kilograms. In some embodiments, base station system 200 is sized so as to fit easily into the trunk of a car or the overhead storage area of a passenger aircraft. Housing 230 may be sized to fit closely around control module 240 so as to remain as small as possible. The diagonal dimension of control module 240 may dictate the size and shape of housing 230.

A removable attachment between base station 202, stand 210, and antenna 220 allows base station system 200 to be disassembled for transportation (e.g., between activity sites or into and out of storage). As such, base station system 200 may be easily packed and transported to and from storage when need. The features of base station system 200, and the features of base station 202, according to embodiments of the present invention provide for a base station system that can be used to monitor individuals 10 in a variety of locations, climates, and whether conditions while preventing damage to control module 240.

In some embodiments, the entire housing 230, or at least a portion thereof, is made of a ductile material with a low modulus of elasticity (i.e. a material that is capable of resisting plastic deformation and cracking when loaded). Such a material may act like a spring to absorb the force of an impact when housing 230 is dropped or hit by a sports object.

While FIG. 2 shows control module 240 surrounding ventilation channel 270 and heat sink 280, all of or a portion of ventilation channel 270 and/or heat sink 280 may surround at least a portion of control module 240. As a non-limiting example, control module 240 may be centrally located within base station 202 and ventilation channel 270 and heat sink 280 may surround control module 240, exclusive of any electrical ports on control module 240 (e.g., USB ports, power outlets, etc.) for interfacing with external components. In some embodiments, control module 240 may surround a centrally located ventilation channel 270 and heat sink 280 and at a portion of ventilation channel 270 and/or heat sink 280 may also surround at least a portion of control module 240.

In some embodiments, base station system 200 itself includes sensors, such as, for example, a GPS sensor (or other position sensor), a gyroscope, a magnetometer, a temperature sensor, a humidity sensor, and/or a wind sensor. Such sensors can provide valuable data that can be used in algorithms to determine metrics associated with individuals 10 and/or sports objects 40.

In some embodiments, base station system 200 may include an external charge/sync unit 247 for charging and/or syncing individual monitors 300 and/or object monitors 350. External charge/sync unit 247 may be electrically coupled to base station 202 using a wired or wireless connection, for example, a radio-frequency (RF) link or a USB cord. External charge/sync unit 247 may include one or more docking ports 248 configured to interface with a docking port 340 located on individual monitors 300 and/or object monitors 350. In some embodiments, external charge/sync unit 247 may be operatively coupled to a power source 290 of control module 240 (e.g., a battery) via, for example, a power cord or a USB cord. In some embodiments, external charge/sync unit 247 may include a power source and/or may be operatively coupled to an external power source.

Figure 3:
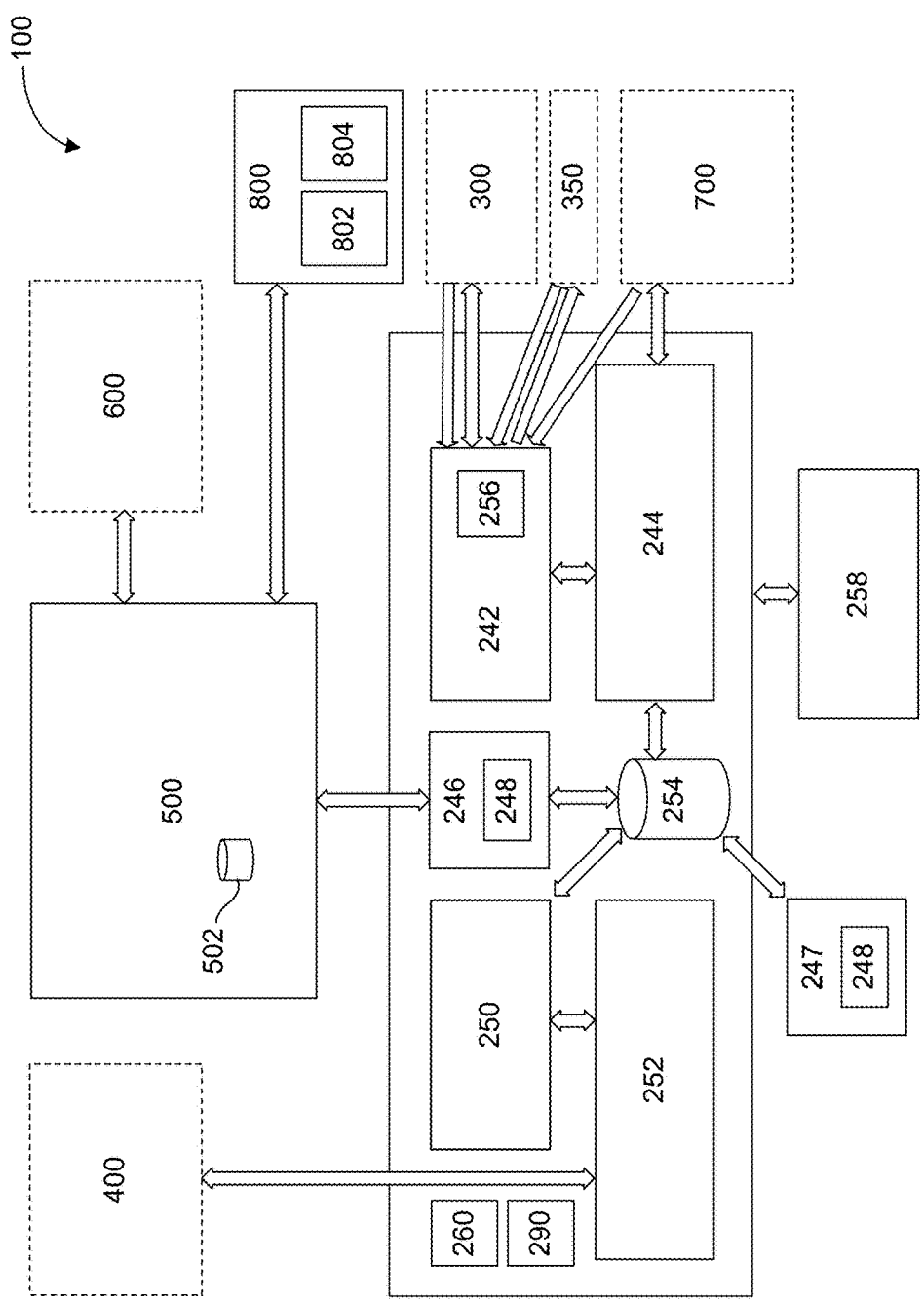
FIG. 3 shows a diagram of a control module and monitoring system according to an embodiment.

FIG. 3 shows a schematic of a group monitoring system 100 according to an embodiment showing the relationship between various components of control module 240 and external devices (e.g., individual monitors 300, object monitors 350, group monitoring devices 400, etc.). In some embodiments, base station 202 includes a reference sensor 258 (e.g., a GPS reference sensor), which may be physically included within base station 202 (e.g., as part of control module 240) or independent of and remotely located from base station 202 at a known position with respect thereto. Reference sensor 258 may be connected to base station 202 via wires or wirelessly. Reference sensor 258 can be used to detect a deviation signal and use it to calculate a correction signal for received position signals (e.g., GPS data). This correction signal can be sent to monitors 300, 350 (e.g., via base station 202). This correction signal can be used to correct position determinations of monitors 300, 350, thereby increasing their accuracy. Determining such a correction signal and then sending it to monitors 300, 350 may achieve efficient use of processing capacity, because monitors 300, 350 are not burdened with determining a correction signal themselves, but simply receive and use a correction signal determined at base station 202 or reference sensor 258.

Base station 202 may transmit and receive data from monitors 300, 350 via an antenna 260 coupled to control module 240 and configured for one or more of RF communication, WLAN communication, ISM communication, cellular (e.g., GSM broad band 2.5G or 3G) communication, other suitable communication, or a combination thereof. In some embodiments, antenna 260 may be included within base station 202. Alternatively or additionally, all or a portion of antenna 260 may be removably attached to base station 202 (e.g., as described herein with respect to antenna 220). Communication between base station 202 and monitors 300, 350 may be bi-directional or uni-directional. Antenna 260 may be a high-gain antenna, and in some embodiments base station 202 includes multiple (e.g., 2) such antennas 260. In some embodiments, base station 202 includes an antenna configured to send and/or receive a positioning signal such as that of a satellite-based positioning system (e.g., GPS). Base station 202 can then determine metrics from the received data.

As shown in FIG. 3, control module may include a data reception module 242, a data processing module 244, an internal central synchronization (sync)/charging module 246, a web server module 252, and a base station database 254. In some embodiments, internal charge/sync unit 246 may be integral with base station 202, such as, for example, with housing 230 and may be operatively coupled to power source 290 or an external power source. In some embodiments, each of these components may be included as part of control module 240 within housing 230. In some embodiments, one or more of these components may be external components electrically coupled to control module 240 via one or more wired or wireless ports (e.g., a USB port). As a non-limiting example, FIG. 3 shows an external central synchronization (sync)/charging unit 247 and an external reference sensor 258 electrically coupled to control module 240.

As described above, control module 240 receives data from monitors 300, 350. Data reception module 242 may be in communication with each active monitor 300, 350. In some exemplary embodiments data reception module 242 receives data from monitors 300, 350 via antenna 260 in communication with monitors 300, 350 through an RF link. Data reception module 242 writes the received data to a data file, which may be, for example, a comma-separated values file or a tab delimited file. The file may be, for example, a single file used to write the data to, or a rolling file (file roll) based on, for example, time, number of entries, or size. The data file may be updated using any suitable interval and parameters. For example, 30 monitors 300, 350 may be active and updating 5 data points at 2 Hz, in order to update the data file in near real time.

Data reception module 242 may perform a data integrity check on the received data. In some embodiments, data reception module 242 decrypts the received data. In some embodiments, data reception module 242 is agnostic to the received data, and does not decrypt the received data. In some embodiments data reception module 242 buffers content as needed.

Data reception module 242 may include a data read module 256 that reads the data from the data file and transmits it to data processing module 244. Data read module 256 may run at any suitable interval, such as, for example, 500 ms (milliseconds), to read the change in the data written to the data file.

Prior to monitors 300, 350 being used during a session of athletic activity, each monitor 300, 350 may be connected to base station 202 (e.g., by docking in a docking port 248, or wirelessly) and may be assigned an encryption key by data processing module 244. Monitors 300, 350 can use this encryption key to securely transmit data to data reception module 242. Data processing module 244 receives data from data reception module 242, as described above, and decrypts the data, if encrypted, by using the unique encryption key assigned to a particular monitor 300, 350. In turn, data processing module 244 may transmit the unencrypted data to base station database 254, for storage.

Base station database 254 is preferably configured for short term storage of data generated during sessions of athletic activity, while long term storage may be accomplished by web server system 500. Base station database 254 may include sufficient storage space for at least all data expected to be generated in 1 session of the athletic activity. In some embodiments, base station database 254 includes sufficient storage space for at least all data expected to be generated in 3 sessions of the athletic activity (e.g., greater than approximately 2 gigabytes). In some embodiments, base station database 254 is configured for long term storage, and includes sufficient storage space, for example, for at least all data expected to be generated in 10 years of use monitoring athletic activities (e.g., greater than approximately 600 gigabytes). Control module 240 may also include power source 290 (e.g., a battery) for powering control module 240. In some embodiments, control module 240 may also include a power control integrated motherboard capable of power-management. In such embodiments, no additional power management may be required for base station system 200.

Logic module 250 polls base station database 254 and applies algorithms to the polled data to determine metrics and alerts. Logic module 250 can determine a wide variety of metrics, including custom-designed metrics, by application of appropriate algorithms. Logic module 250 can transmit such metrics to web server module 252. Logic module may perform any or all of the functions of the logic module(s) and control module 240 may be configured to determine any of the metrics and alerts discussed in U.S. application Ser. No. 13/077,494, filed Mar. 31, 2011, and published as U.S. Patent Pub. No. 2012/0254934; U.S. application Ser. No. 13/077,510, filed Mar. 31, 2011, and published as U.S. Patent Pub. No. 2012/0253484; and U.S. application Ser. No. 13/543,428, filed Jul. 6, 2012, and published as U.S. Patent Pub. No. 2013/0041590. Each of these applications is incorporated herein in its entirety by reference thereto.

In some embodiments, system components (e.g., sensors 302, individual monitors 300, object monitors 350, base stations 202, group monitoring devices 400, web server systems 500, analysis devices 600, and camera monitoring systems 700) may include assessment hardware and/or software to monitor on-board operating conditions, and/or operating conditions of other system components. Such monitored operating conditions may include, for example, component serial number, strength (including presence) of GPS signal at component, strength (including presence) of communication signal at component, remaining battery power of battery of component, whether battery of component is charging or discharging, data sent from and/or received by component (e.g., active data transmission, time of last data transmission, volume of data transmitted, rate of data transmission), available memory of component, current software or firmware version installed on component, target software or firmware version for component, synchronization status of component, errors in operation of component, time since last communication received from component, number of other components docked at component, whether component is properly located and/or oriented with respect to an associated individual, object, or area).

In some embodiments, data relating to operating conditions of system components can be transmitted between system components (e.g., as described herein for any other data transfer, including metric-related data transfer). For example, operating conditions data relating to monitors 300, 350 can be transmitted from monitors 300, 350 to base station 202. Also, for example, operating conditions data relating to monitors 300, 350 and/or base station 202 can be transmitted from base station 202 (e.g., via logic module 250 and web server module 252) to a remote device (e.g., group monitoring device 400, analysis device 600). Further, in some embodiments operating conditions data can be stored (e.g., as described herein for any other data storage, including metric-related data storage). For example, operating conditions data can be stored in base station database 254.

As shown in FIGS. 4 and 5, an individual monitor 300 or object monitor 350, for monitoring an individual 10 or a sports object 40, respectively, may be coupled to individual 10 or sport object 40. Individual 10 may be, for example, a participant in an athletic activity on a playing field 30 (e.g., a player; a referee; or a support person such as a ball boy, golf caddy, or line man). Sports object 40 may be, for example, any type of sport ball, any type of sport "stick" (e.g., a baseball bat, hockey stick, golf club, table tennis paddle, or tennis racquet), a sport glove (e.g., a boxing glove), a bicycle, an oar, a shoe, a boot, a ski, a hat, a helmet, a band, a skateboard, a surfboard, or a pair of glasses or goggles used by an individual (e.g., individual 10) during an athletic activity. Individual monitor 300 and/or object monitor 350 may include or be in communication with a variety of sensors 302, including, but not limited to, an accelerometer, a pedometer, a heart rate monitor, a position sensor, an impact sensor, a camera, a magnetometer, a gyroscope, a microphone, a temperature sensor, a pressure sensor, a respiration sensor, a posture sensor, a lactate sensor, and a wind sensor. Group monitoring system 100 can include any or all of these or other sensors, eliminating the need for separate systems to monitor different characteristics. Further, by integrating and processing data streams from multiple different sensors, group monitoring system 100 can determine and provide metrics based on data representing different monitored characteristics. This eliminates the need to manually combine data streams to determine metrics based on multiple data streams (e.g., to determine high level training insights).

In some embodiments, individual monitor 300 may include at least one of a sensor garment 304, a heart rate monitor 306, and a position sensor 308. In some embodiments, object monitor 350 may include at least one of a position sensor 308, an acceleration sensor 310 and a magnetometer module 332. Position sensor 308 may include, for example, a position sensor for use with a satellite-based positioning system (e.g., GPS (global positioning system)), a position sensor for use with a beacon system (e.g., position determination using triangulation and/or time differences of signals received by antennas at known positions about a field or activity area), or a position sensor for use with any other suitable position-determining system.

Generally, sensors 302 are mounted to individuals 10 in preparation for participation by individuals 10 in a session of athletic activity. Sensors 302 mounted to a particular individual 10 are coupled, either via wires or wirelessly, to individual monitor 300, also mounted on the particular individual 10. Sensors 302 in communication with an individual 10's individual monitor 300 may sense characteristics about individual 10 during participation by individual 10 in the session of athletic activity, and may transmit data indicative of the characteristics to individual monitor 300. Individual monitor 300 in turn may transmit the data to base station 202 during or after the session of athletic activity.

Sensors 302 in communication with an object 40's object monitor 350 may sense characteristics about object 40, for example while object 40 is used (e.g., by individual 10) during the session of athletic activity, and may transmit data indicative of the characteristics to object monitor 350. Object monitor 350 in turn may transmit the data to base station 202 during or after the session of athletic activity.

In some embodiments, a first individual monitor 300 may transmit data indicative of characteristics about its monitored individual 10 to a second monitor (e.g., an individual monitor 300 monitoring a different individual 10, or an object monitor 350 monitoring a sports object 40). In some embodiments, a first object monitor 350 may transmit data indicative of characteristics about its monitored object 40 to a second monitor (e.g., an individual monitor 300 monitoring an individual 10, or a second object monitor 350 monitoring a different sports object 40). Such communication among monitors 300, 350 may be wireless according to any suitable protocol. For example, such communication may be based on RFID (radio frequency identification) signals, magnetic signals, WLAN (wireless local area network) signals, ISM (industrial, scientific, and medical) band signals, Bluetooth® (or Bluetooth® Low Energy (BTLE)) signals, or cellular signals.

Such communication among monitors 300, 350 may facilitate determinations and calculations based on data from more than one source. For example, if two monitored individuals 10 kick a sports object 40 (e.g., a ball), object monitor 350 of sports object 40 can receive data from each of the individual monitors 300 of the individuals 10. Such data can be compared with data from the object monitor 350 of sports object 40 and can be used to determine (e.g., at sports object 40, base station 202, or an accessing device) which of the two individuals kicked sports object 40 first. Also for example, if a monitored individual 10 kicks a sports object 40 (e.g., a ball), individual monitor 300 of individual 10 can receive data from object monitor 350 of sports object 40 indicating the force with or speed at which the sports object 40 was kicked, or the resulting speed, direction of motion, or predicted landing location of the sports object 40 due to the kick. Such data may be sensed by a pressure sensor of the sports object 40, and transmitted wirelessly to the individual monitor 300 of the monitored individual 10. Such data can be compared with data from the individual monitor 300 and can be used to determine characteristics of the kick of individual 10. In some embodiments, based on such data, group monitoring system 100 may provide a recommendation as to how individual 10 may improve his or her kick (e.g., to achieve greater distance, speed, height).

Figure 6:
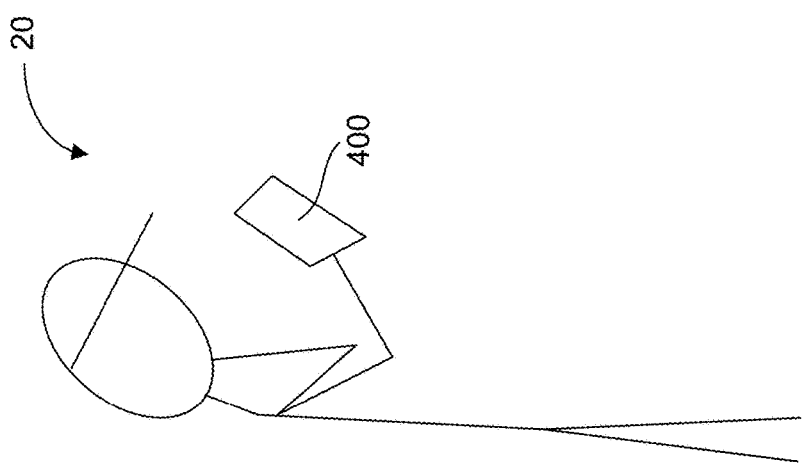
FIG. 6 shows a group monitoring device according to an embodiment.

In some embodiments, some or all of transmissions of data among system components of group monitoring system 100 may occur in real time. "Real time" as used herein may include delays inherent to transmission technology, delays designed to optimize resources, and other inherent or desirable delays that would be apparent to one of skill in the art. In some embodiments, some or all of these transmissions may be delayed from real time, or may occur after completion of the activity. Base station 202 receives the data and determines metrics from the data, where the metrics may be representations of the characteristics measured by sensors 302, or may be representations of further characteristics derived from the data through the use of algorithms and other data manipulation techniques. Metrics may be based on data from individual monitors 300 only, from object monitors 350 only, or from both individual monitors 300 and object monitors 350. Base station 202 may in turn transmit the metrics during the session of athletic activity to group monitoring device 400, which receives the metrics and displays a representation of the metrics. In some embodiments, group monitoring device 400 may be used by a trainer 20, as shown in FIG. 6.

Group monitoring device 400 may receive metrics associated with a plurality of individuals 10 and/or one or more objects 40, and may display the received metrics in association with the individual 10 and/or object 40 with which they are associated. In this way, trainer 20 viewing group monitoring device 400 during the session of athletic activity receives detailed information about multiple individuals 10 and/or object(s) 40, and can act on that information as it is determined necessary or expedient, thereby efficiently monitoring and managing individuals 10 during the session of athletic activity.

Display of the metrics can represent real-time summaries of individuals 10 or groups thereof, and can facilitate comparison of one or more individuals 10 or groups thereof with one or more other individuals 10 or groups thereof, or comparison of one or more individuals 10 or groups thereof from a first time with one or more individuals 10 or groups thereof from a second time.

In some embodiments, individual monitors 300 and/or object monitors 350 calculate metrics based on the data (e.g., data generated by sensors 302), and transfer these metrics to base station 202 along with or instead of the data. In some embodiments, base station 202 transmits the data to group monitoring device 400, along with or instead of the metrics. In some exemplary embodiments, group monitoring device 400 calculates metrics based on the data.

Figure 7:
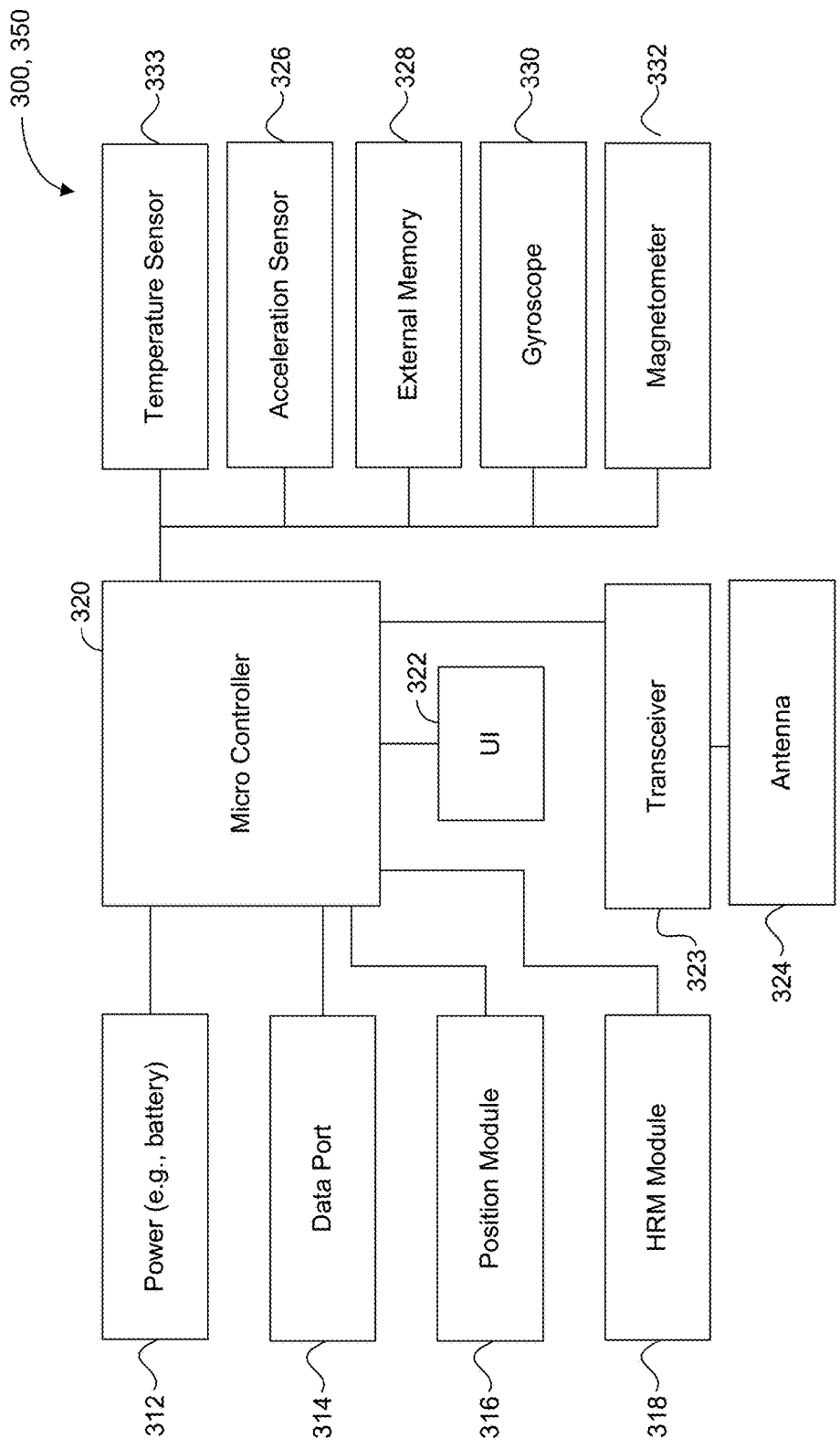
FIG. 7 shows a diagram of an individual monitor according to an embodiment.

In some embodiments, as shown in FIG. 7, individual monitor 300 and/or object monitor 350 may include a battery 312, a data port 314, a position module 316, a heart rate monitor module 318, a controller 320, a user interface 322, a transceiver 323, an antenna 324, an acceleration sensor module 326, a memory 328, a gyroscope module 330, a magnetometer module 332, and a temperature sensor module 333. The sensors and corresponding modules discussed herein are exemplary only; other sensors and modules can be used in conjunction with the embodiments discussed herein. Battery 312 (or any other suitable power source) provides power to individual monitor 300 and/or object monitor 350 and may be, for example, built into or removable from individual monitor 300 and/or object monitor 350, and may be rechargeable or non-rechargeable. Data port 314 can facilitate information transfer to and from individual monitor 300 and/or object monitor 350 and may be, for example, a universal serial bus (USB) port. In some embodiments, data port 314 can additionally or alternatively facilitate power transfer to battery 312, in order to charge battery 312. As will be appreciated, transceiver 323 may include data transmitting and receiving capability and may include a single component or separate components.

Elements of individual monitor 300 (or object monitor 350) may interconnect with one another using a variety of techniques, such as, for example, wires, printed circuit boards, conductive yarn, conductive fabric, printed conductive layers on fabric, a printed (wire) harness, wireless communications technology, serial ports, serial peripheral interfaces, other connection techniques, or a combination thereof. Each monitor 300, 350 is portable with respect to base station 202. In some embodiments, each individual monitor 300 can be carried by an individual 10 participating in an athletic activity. Each monitor 300, 350 may itself include sensors 302, and/or may be in communication with sensors 302 carried by individual 10 and/or sports object 40 and located remotely from monitor 300, 350. Each monitor 300, 350 can be paired with base station 202 and associated with an individual 10 and/or sports object 40. Each monitor 300, 350 may include a unique identifier. The unique identifier may be represented by, for example, a number imprinted on a viewable surface of individual monitor 300 and/or object monitor 350 (or an article associated therewith, such as, for example, a garment or sports object), or data communicated or displayed when a button associated with individual monitor 300 and/or object monitor 350 is pressed or when a request signal is received from base station 202.

To be paired with base station 202, individual monitor 300 and/or object monitor 350 can be received by or otherwise communicatively connected to base station 202 (e.g., via a docking port 248 of base station system 200—see, e.g., FIG. 3). Base station 202 can then record the unique identifier of the individual monitor 300 and/or object monitor 350, and can assign a unique encryption key to the individual monitor 300 and/or object monitor 350. This encryption key can be used to support secure transmission of data during the session of athletic activity. Such secure transmission of data may be, for example, from individual monitors 300 and/or object monitors 350 to base station 202, from base station 202 to individual monitors 300 and/or object monitors 350, and from one individual monitor 300 and/or object monitor 350 to one or more other individual monitors 300 and/or object monitors 350. The encryption key can be renewed when required or desired (e.g., at the beginning of each new session of athletic activity).

Via an administrative interface of base station 202, which may be, e.g., an input (such as display 941 having user input 942) and a display located on base station 202, or which may be incorporated into a remote device such as, e.g., group monitoring device 400 or analysis device 600 identification information of individual 10 (e.g., individual 10's name and/or jersey number) and/or sports object 40 (e.g., sports object 40's type and/or size) can be associated with the unique identifier of the individual monitor 300 and/or object monitor 350 to be carried by individual 10 and/or sports object 40. Once properly paired with base station 202 and associated with individual 10, individual monitor 300 can be disconnected from base station 202 (e.g., by being removed from docking port 248).

Monitors 300, 350 may include a position module 316 for determining data indicative of the location of individual monitor 300 (and thus the location of individual 10 carrying individual monitor 300), a heart rate monitor module 318 for determining data indicative of the heart rate of individual 10, a three-axis acceleration sensor module 326 for determining data indicative of the acceleration of individual 10, a gyroscope module 330 for determining data indicative of the orientation of individual 10 with respect to, for example, playing field 30 and/or base station 202, and a magnetometer module 332 for calibrating body motion data determined by gyroscope module 330 and acceleration sensor module 326. In some embodiments, individual monitor 300 may be a portable pod-like device. Such a pod-like device can be carried by individual 10, for example, in a shirt, shoe, or other apparel or equipment worn by individual 10. In some embodiments, individual monitor 300 may be a near-field communication (NFC) device (e.g., a radio-frequency identification (RFID) tag) or any active or passive communication device.

Similarly, in an exemplary embodiment, object monitor 350 is a device that includes a position module 316 for determining data indicative of the location of object monitor 350 (and thus the location of sports object 40 carrying object monitor 350), a heart rate monitor module 318 for determining data indicative of the heart rate of an individual (e.g., individual 10) interacting with sports object 40 (e.g., gripping or otherwise holding sports object 40 such that a heart rate sensor of object monitor 350 can sense a pulse of the individual), a three-axis acceleration sensor module 326 for determining data indicative of the acceleration of sports object 40, a gyroscope module 330 for determining data indicative of the orientation of sports object 40 with respect to, for example, playing field 30 and/or base station 202, and a magnetometer module 332 for calibrating motion data determined by gyroscope module 330 and acceleration sensor module 326. In some embodiments, object monitor 350 is a pod-like device, which may be configured for attachment to a sports object 40 (e.g., coupled to a racquet or bat upon an external surface thereof). In some embodiments, object monitor 350 is a chip integrated within a sports object 40 (e.g., coupled to a ball beneath the exterior surface thereof). In some embodiments, object monitor 350 may be a near-field communication (NFC) device (e.g., a radio-frequency identification (RFID) tag) or any active or passive communication device.

Each of position module 316, heart rate monitor module 318, acceleration sensor module 326, gyroscope module 330, and magnetometer module 332 may themselves include associated sensors (e.g., a GPS sensor, a heart rate sensor, an acceleration sensor, a gyroscope, and a magnetometer, respectively), or may be in communication with such an associated sensor. Such communication may be wired or wireless. In the case of wireless communication, each module may be communicatively paired with an associated sensor, to avoid miscommunication and interference due to communication of other components. In some embodiments, some or all of these and other modules may be included in a single module.

In an exemplary embodiment, some or all of sensors 302 are incorporated into sensor garment 304. In such an embodiment, sensors 302 incorporated into sensor garment 304 may connect to individual monitor 300 via wires also incorporated into sensor garment 304.

During participation by individual 10 in the session of athletic activity, sensors 302 of individual monitor 300 sense various characteristics of individual 10, generate data indicative of those characteristics, and transmit that data to memory 328 of individual monitor 300, where it is stored. During use of sports object 40 in the session of athletic activity, sensors 302 of object monitor 350 sense various characteristics of sports object 40, generate data indicative of those characteristics, and transmit that data to memory 328 of object monitor 350, where it is stored. In turn, individual monitor 300 and/or object monitor 350 wirelessly transmit the generated data to base station 202. The resolution at which the data is stored in memory 328 (of individual monitor 300 and/or of object monitor 350) and at which the data is transmitted to base station 202 may be different, in order to optimize bandwidth, to optimize battery life, or for any other reason. For example, the heart rate of individual 10 may be sampled by heart rate monitor module 318 at 200 Hz, and data indicative of the heart rate may be generated at 200 Hz and stored in memory 328 at 200 Hz, but may be transmitted wirelessly to base station 202 at 2 Hz during the athletic activity. In some embodiments, memory 328 is sufficient to store data from a single session of athletic activity (e.g., 3 hours of data collection), and in some embodiments memory 328 is sufficient to store data from up to 5 sessions of athletic activity (e.g., up to 15 hours of data collection).

Acceleration sensor module 326 can determine data indicative of acceleration, which can be used in calculating, for example, speed, distance, and metrics that will be discussed below. In some embodiments, the data indicative of acceleration can be used to increase accuracy of position data by, for example, using an accelerometer as a step counter or to determine a filter for a GPS signal calculation. In some embodiments, the data indicative of acceleration can be used, in conjunction with pattern recognition software, to determine the activity (e.g., the sport, movement, and/or drill) that an individual 10 is performing, and/or that sports object 40 is being used in.

Additionally, acceleration sensor module 326 can be used in conjunction with magnetometer module 332 and gyroscope module 330 in order to calibrate motion determinations. For example, information indicative of impact, change in motion, gravity, and step or other impact counting can be obtained using acceleration sensor module 326. Angular movement can be obtained using gyroscope module 330, and the absolute "North" orientation can be obtained using magnetometer module 332. These sensor readings can be used to determine, for example, the posture of an individual 10, gravity, orientation of individual 10 and/or object 40 in space, and heading of individual 10 and/or object 40.

Position module 316 may determine data indicative of absolute position at, for example, 10 Hz. Acceleration sensor module 326 may determine data indicative of acceleration at, for example, 200 Hz. Gyroscope module 330 may determine data indicative of change of position and orientation at, for example, 200 Hz. Magnetometer module 332 may determine data indicative of orientation at, for example, 200 Hz. Data may be transmitted from individual monitor 300 and/or object monitor 350 (via antenna 324) to base station 202 using a radio frequency (RF) link. The RF link between individual monitor 300 and base station 202 and/or between object monitor 350 and base station 202 should be sufficiently robust to cover the expected area of the athletic activity (e.g., playing field 30). In some embodiments, the RF link is sufficient to cover a distance of 50-300 meters under all operating conditions. In some embodiments, the RF link uses a globally available, license-free band (e.g., the 2.4 GHz frequency). In some embodiments, the RF link is configurable to cover multiple license-free bands used throughout the world. In some embodiments base station 202 is capable of using the RF link to link to a plurality of individual monitors 300 and/or object monitors 350 simultaneously, for example, up to 25 individual monitors 300 and/or object monitors 350, or up to 30 individual monitors 300 and/or object monitors 350.

Figure 8:
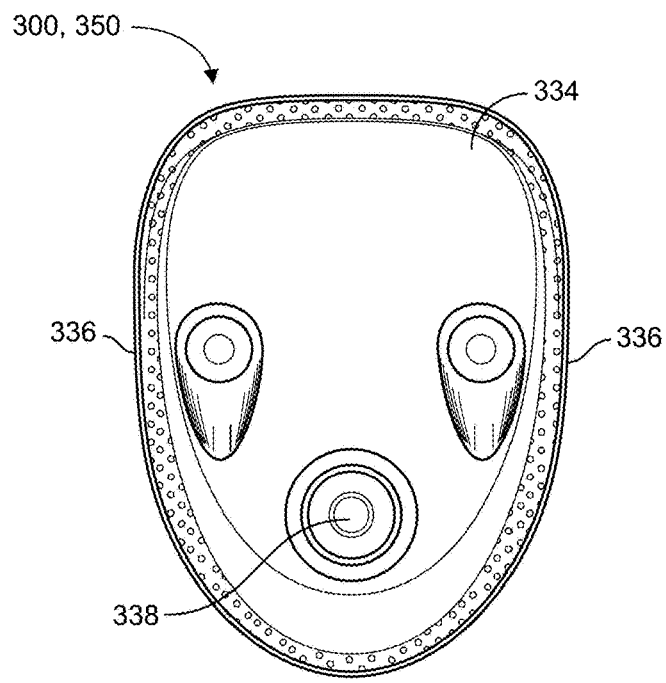
FIG. 8 shows a front view of an individual monitor according to an embodiment.
Figure 9:
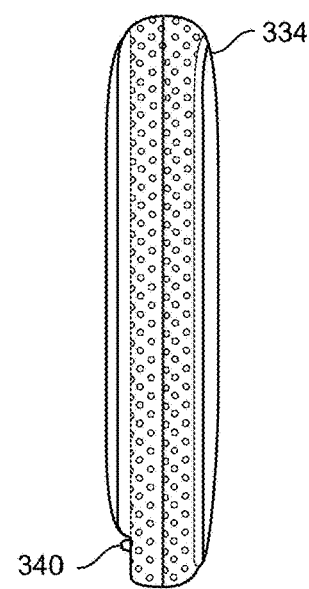
FIG. 9 shows a side view of an individual monitor according to an embodiment.
Figure 10:
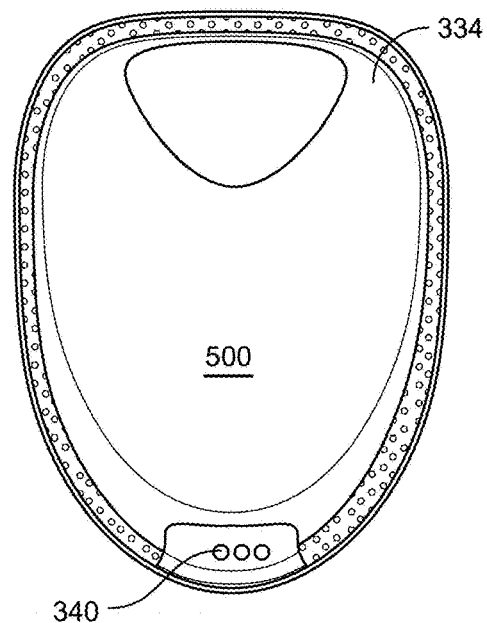
FIG. 10 shows a back view of an individual monitor according to an embodiment.

As shown in FIGS. 8-10, individual monitor 300 may be a pod-like device including a plastic housing 334 that contains components of individual monitor 300, such as the modules discussed above, for example. Object monitor 350 may also be, for example, a pod-like device, including a plastic housing 334 that contains components of object monitor 350, such as the modules discussed above, for example. Object monitor 350 may be configured for attachment to a sports object 40 (e.g., coupled to a racquet or bat upon an external surface thereof) or may be a chip integrated within a sports object 40 (e.g., coupled to a ball beneath the exterior surface thereof).

Individual monitor 300 and/or object monitor 350 may include connectors 336 that can provide connection to conductors to removably connect individual monitor 300 and/or object monitor 350 to, for example, sensors 302. Connectors 336 may removably connect to sensors 302 via, for example, snaps, clips, latches, or any other suitable technique. Individual monitor 300 and/or object monitor 350 may further include or be coupled to an input 338, which may be a button and which may function to turn individual monitor 300 and/or object monitor 350 on or off, when appropriately manipulated. Input 338 may include a background light indicator, which may be, for example, one or more light emitting diodes (LEDs) that indicate qualities of individual monitor 300 and/or object monitor 350. Such qualities may include, for example, state of operation (e.g., on, off, active, inactive, charging, low battery), memory status, and battery status. In some embodiments, individual monitor 300 and/or object monitor 350 includes or is coupled to a visual display, such as, for example, a liquid crystal display (LCD) screen, that can display this and other information.

Individual monitor 300 and/or object monitor 350 may further include or be coupled to a docking port 340, which facilitates wired communication with base station 202, and which can facilitate charging of battery 312 of individual monitor 300 and/or object monitor 350, when individual monitor 300 and/or object monitor 350 is docked with base station 202. Housing 334 of individual monitor 300 and/or object monitor 350 may be sized so as to accommodate components of individual monitor 300 and/or object monitor 350 while minimally interfering with individual 10's performance of the athletic activity, and/or with use of sports object 40 during the athletic activity. Housing 334 may be sized, for example, to fit into a pocket or cavity of a garment (e.g., sensor garment 304) or sports object 40. In some exemplary embodiments, dimensions of housing 334 do not exceed 70 mm by 55 mm by 11 mm.

In some exemplary embodiments, housing 334 is water resistant, and all openings (e.g., docking port 340, connectors 336) are sealed while in use during athletic activity. Such water resistance can be achieved by a close fit between exposed parts of individual monitor 300 (particularly housing 334), by use of plugs (e.g., plastic or rubber) that fit into openings, by use of a water resistant sealing compound, by other techniques, or by any combination thereof Individual monitor 300 and/or object monitor 350 may include data processing capabilities, such as raw data reduction and filtering. For example, a processor of individual monitor 300 (e.g., controller 320) may be configured to receive raw data from sensors 302 and to process such data at the individual monitor 300 and/or object monitor 350, prior to transmission to base station 202. For example, rather than transmitting raw data representing electrical activity sensed by heart rate monitor 306 or acceleration sensor 310, controller 320 of individual monitor 300 and/or object monitor 350 may process the raw data to calculate heart rate, number of heart beats in a given period, magnitude of acceleration, rate of change of acceleration, or other metrics of interest, which can be transmitted to base station 202. In some embodiments, controller 320 of individual monitor 300 and/or object monitor 350 may use a unique encryption key (assigned by data processing module 244 of base station 202) to encrypt data in order to securely transmit such data to base station 202. Such processing of data at individual monitor 300 and/or object monitor 350 is not necessary, however, and raw data can be transmitted directly to base station 202 without such processing.

Operation of individual monitor 300 and/or object monitor 350 may be controlled by software stored in individual monitor 300 and/or object monitor 350 (e.g., stored in memory 328). This software can be updated when necessary or appropriate. Software can be updated via communication with base station 202, which may send software updates to individual monitor 300 and/or object monitor 350 wirelessly. Alternatively or additionally, software of individual monitor 300 and/or object monitor 350 may be updated through direct connection with base station 202 via docking ports 248 such that firmware of individual monitor 300 and/or object monitor 350 may be flashed appropriately.

Sensors 302 are selected and configured to provide a basis for determination of metrics of the individual 10 and/or sports object 40 with which they are associated. As used herein, "metrics" may refer to representations of characteristics relevant to individual 10 and/or sports object 40 or one or more groups of individuals 10 and/or sports objects 40, and may be, for example, physiological-, performance-, or location-based. A "metric" may simply be a representation of a characteristic sensed by one of sensors 302, or may be a representation of a quality derived from data indicative of characteristics measured by one of sensors 302. For example, an acceleration sensor 310 senses acceleration, and provides data indicative of this characteristic. This data can be represented as a metric. Additionally, this data can be further processed to determine further metrics such as velocity, direction of acceleration, and distance. Processing involving formulas and algorithms that work on the data received from sensors 302 (including data from different sensors 302) and other sources can be used to determine a wide variety of results (including, for example, metrics, alerts, markers, targets, goals) determined to be useful to trainer 20, including custom-designed results.

In some embodiments, such other sources that can provide data to group monitoring system 100 may include, for example, other sensors in communication with system components (e.g., a temperature or wind sensor coupled to base station 202) or sensors of personal equipment of individuals 10 (e.g., a pedometer, heart rate monitor, weight scale, sleep monitor, or respiration monitor).

The data from such other sources may be gathered separate from or during the monitored athletic activity. For example, such data may be gathered during a private training session for an individual 10 (and may be used, for example, during a group training session monitored by group monitoring system 100) or during training in a different sport, group, or season than the sport, group, or season being monitored.

Such other sources may communicate with group monitoring system 100 in any suitable way, such as, for example, via wired or wireless communication with a system component or by manual input of data output from such other sources (e.g., individual 10 reading the output of his or her personal pedometer, and inputting it into group monitoring system 100 via an input of a system component). In some embodiments, such other sources may transmit data to a database, which may in turn transmit such data to group monitoring system 100 (e.g., via web server system 500 or base station 202).

Metrics can provide useful information individually about multiple individuals 10 and/or sports objects 40, and can provide useful information about groups of individuals 10 and/or sports objects 40. Metrics can also take into account attributes of a particular individual 10 or group of individuals 10, such as, for example, height, weight, endurance, and top speed. Metrics can also take into account attributes of a particular sports object 40 or group of sports objects 40, such as, for example, speed, trajectory, flight time, reaction time, acceleration, flight distance, launch angle, orientation, and rotation rate.

Metrics can also relate to an athletic activity itself, or to game events. For example, the character of a force sensed at sports object 40 may indicate that sports object has been passed from one individual 10. Also for example, the character of a decrease in speed and/or rotation may be caused by sports object 40 contacting a net, such as a goal net, and may indicate that a goal has been scored. Also for example, a coincident decrease in movement or speed of a number of individuals 10 may indicate the end of a period of play.

In some embodiments, such other sources that can provide data to group monitoring system 100 may include, for example, other sensors in communication with system components (e.g., a temperature or wind sensor coupled to base station 202) or sensors of personal equipment of individuals 10 (e.g., a pedometer, heart rate monitor, weight scale, sleep monitor, or respiration monitor).

The data from such other sources may be gathered separate from or during the monitored athletic activity. For example, such data may be gathered during a private training session for an individual 10 (and may be used, for example, during a group training session monitored by group monitoring system 100) or during training in a different sport, group, or season than the sport, group, or season being monitored.

Such other sources may communicate with group monitoring system 100 in any suitable way, such as, for example, via wired or wireless communication with a system component or by manual input of data output from such other sources (e.g., individual 10 reading the output of his or her personal pedometer, and inputting it into group monitoring system 100 via an input of a system component). In some embodiments, such other sources may transmit data to a database, which may in turn transmit such data to group monitoring system 100 (e.g., via web server system 500 or base station 202).

As shown in FIG. 11, base station system 200 may communicate with (i.e., transmit information to and receive information from) various external devices, including, but not limited to, individual monitors 300, object monitors 350, group monitoring device 400, camera monitoring systems 700.

As shown in FIG. 12, group monitoring device 400 may include display 402 for displaying information received from base station system (e.g., metrics). In some embodiments, group monitoring device 400 includes an input 404. In a preferred embodiment, group monitoring device 400 may be a tablet computing-style device (such as a tablet personal computer or an iPad®, marketed by Apple Inc.®). Group monitoring device 400 may be, however, any other suitable device, such as, for example, a laptop computer, a smartphone, a personal computer, a mobile phone, an e-reader, a PDA (personal digital assistant), a smartphone, a wristwatch device, a display integrated into a garment (e.g., into a sleeve or arm band), or other similar device capable of receiving and displaying information and receiving input. In some embodiments, group monitoring system 100 includes a plurality of group monitoring devices 400, which may be carried by individuals 10 (e.g., during participation in a monitored athletic activity). For simplicity and clarity of explanation, group monitoring device 400 is herein described primarily as used by trainer 20. Group monitoring device may be used similarly, however, by any person, including individuals 10.

As shown in FIG. 13, analysis device 600 may include a display 602 and an input 604. In a preferred embodiment, analysis device 600 may be a tablet computing-style device (such as a tablet personal computer or an iPad®, marketed by Apple Inc.®). Analysis device 600 may be, however, any other suitable device, such as, for example, a laptop computer, a smartphone, or a personal computer. Analysis device 600 can access data in web server database 502 and display the information to a user of analysis device 600 (e.g., trainer 20). In some embodiments, the information may be displayed using dedicated or general-purpose software (e.g., a dedicated software interface, a web browser). Although analysis device 600 and group monitoring device 400 are described separately herein, in some embodiments, group monitoring device 400 and analysis device 600 are the same device.

In some embodiments, analysis device 600 can be located at a remote location with respect to base station 202 or the relevant athletic activity, and can be used to access and display data and metrics in real time. In such an embodiment, base station 202 can transfer the data and metrics to web server system 500 in real time, so that the data and metrics can be accessed for display by analysis device 600. Such an embodiment may be useful for a user to monitor an ongoing session of athletic activity from a remote location (e.g., a trainer 20 that could not be present at a match, or a team owner that desires to monitor a training session without physically attending the session).

After completion of a session of athletic activity, a trainer 20 may use analysis device 600 to review and analyze information about individuals 10, including information about past performances of individuals 10 during past sessions of athletic activity. Depending on the number of past sessions of athletic activity for which data is available, and other available data in web server database 502, post-session analysis of an individual 10 using analysis device 600 may provide trainer 20 with information spanning a longer period than the information provided during an athletic activity by group monitoring device 400, which may facilitate long-term evaluation of individual(s) 10. Trainer 20 may access and view the data using analysis device 600, however, in much the same way as has been described above with respect to group monitoring device 400. Group monitoring device 400 and analysis device may be configured to display any the information, metrics, etc. discussed in U.S. application Ser. No. 13/077,494, filed Mar. 31, 2011, and published as U.S. Patent Pub. No. 2012/0254934; U.S. application Ser. No. 13/077,510, filed Mar. 31, 2011, and published as U.S. Patent Pub. No. 2012/0253484; and U.S. application Ser. No. 13/543,428, filed Jul. 6, 2012, and published as U.S. Patent Pub. No. 2013/0041590. Each of these applications is incorporated herein in its entirety by reference thereto.

In some embodiments, group monitoring system 100 and/or components thereof (e.g., base station 202, individual monitor 300, object monitor 350, etc.) may include or be used with elements of another monitoring system, such as, for example, those disclosed in U.S. patent application Ser. No. 12/467,944, filed May 18, 2009, now U.S. Pat. No. 8,033,959; U.S. patent application Ser. No. 12/467,948, filed May 18, 2009, now U.S. Pat. No. 8,105,208; U.S. patent application Ser. No. 13/077,494, filed Mar. 31, 2011, and published as U.S. Patent Pub. No. 2012/0254934; U.S. patent application Ser. No. 13/077,520, filed Mar. 31, 2011, now U.S. Pat. No. 8,818,478; U.S. patent application Ser. No. 13/077,510, filed Mar. 31, 2011, and published as U.S. Patent Pub. No. 2012/0253484; U.S. patent application Ser. No. 13/446,937, filed Apr. 13, 2012, and published as U.S. Patent Pub. No. 2013/0274635; U.S. patent application Ser. No. 13/446,982, filed Apr. 13, 2012, and published as U.S. Patent Pub. No. 2013/0274040; U.S. patent application Ser. No. 13/446,986, filed Apr. 13, 2012, and published as 2013/0274904; and U.S. patent application Ser. No. 13/543,428, filed Jul. 6, 2012, and published as 2013/0041590. Each of these applications is incorporated herein in its entirety by reference thereto.

Figure 14:
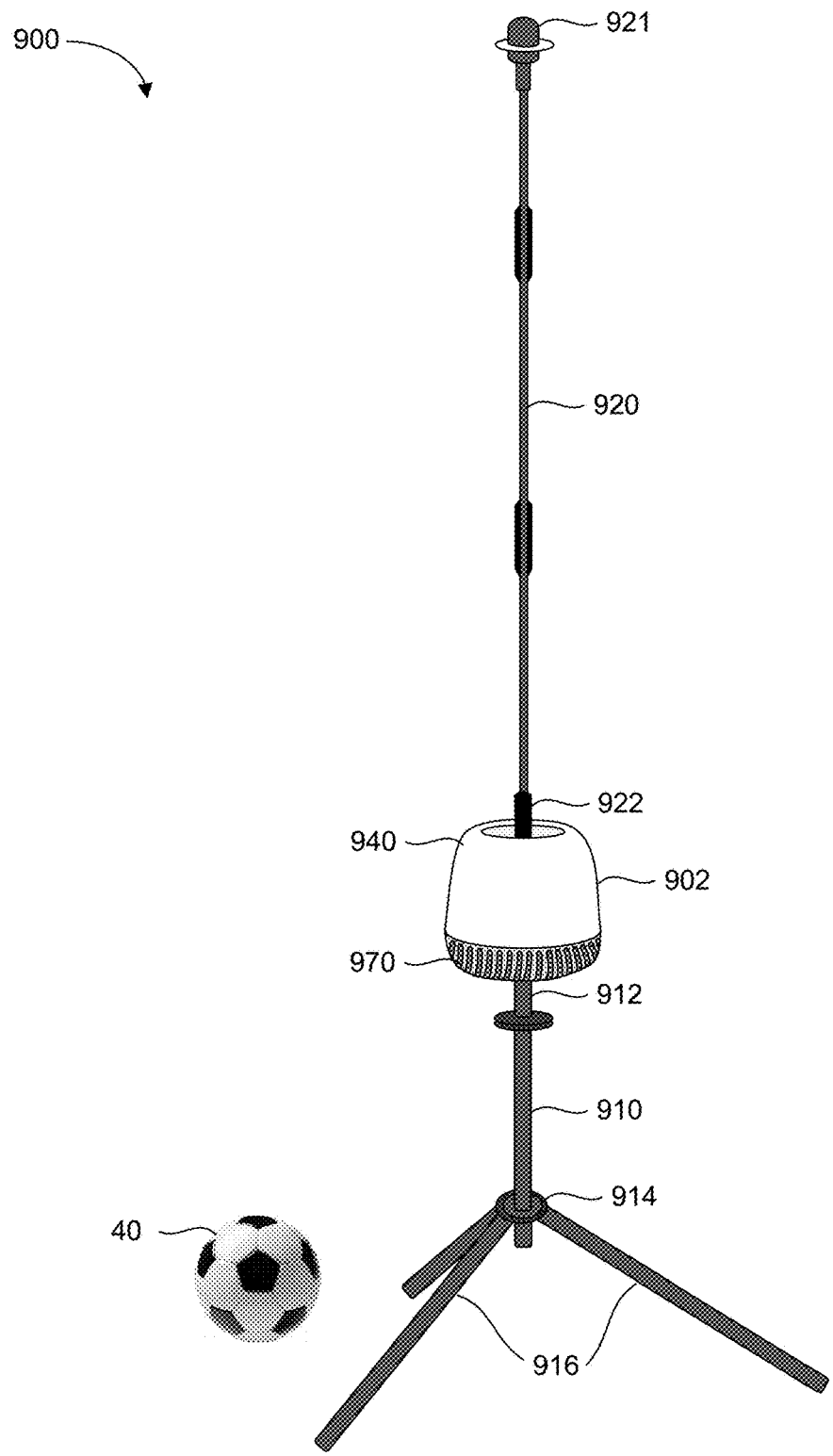
FIG. 14 shows a base station system according to an embodiment.
Figure 15:
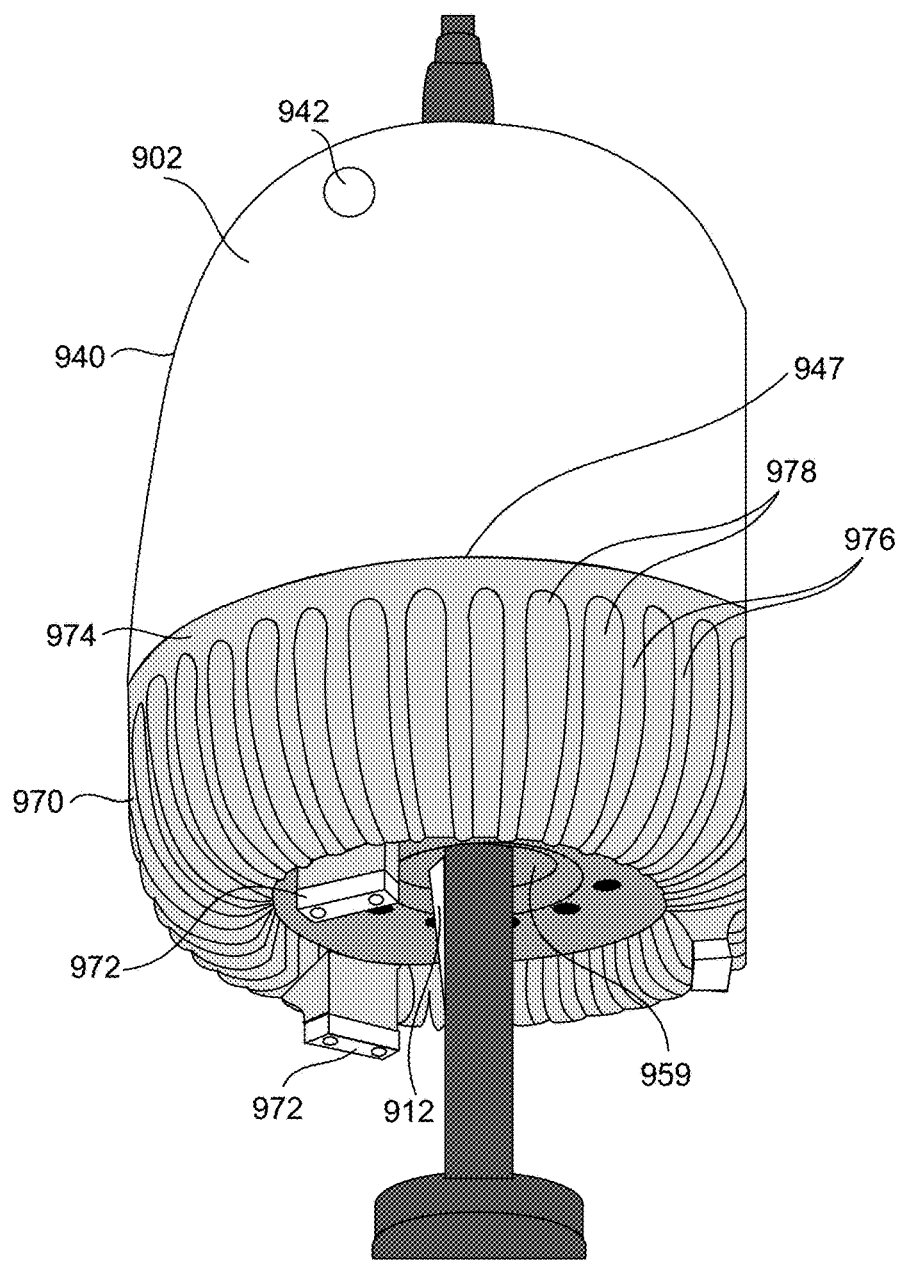
FIG. 15 shows a partial view of a base station according to an embodiment.
Figure 16:
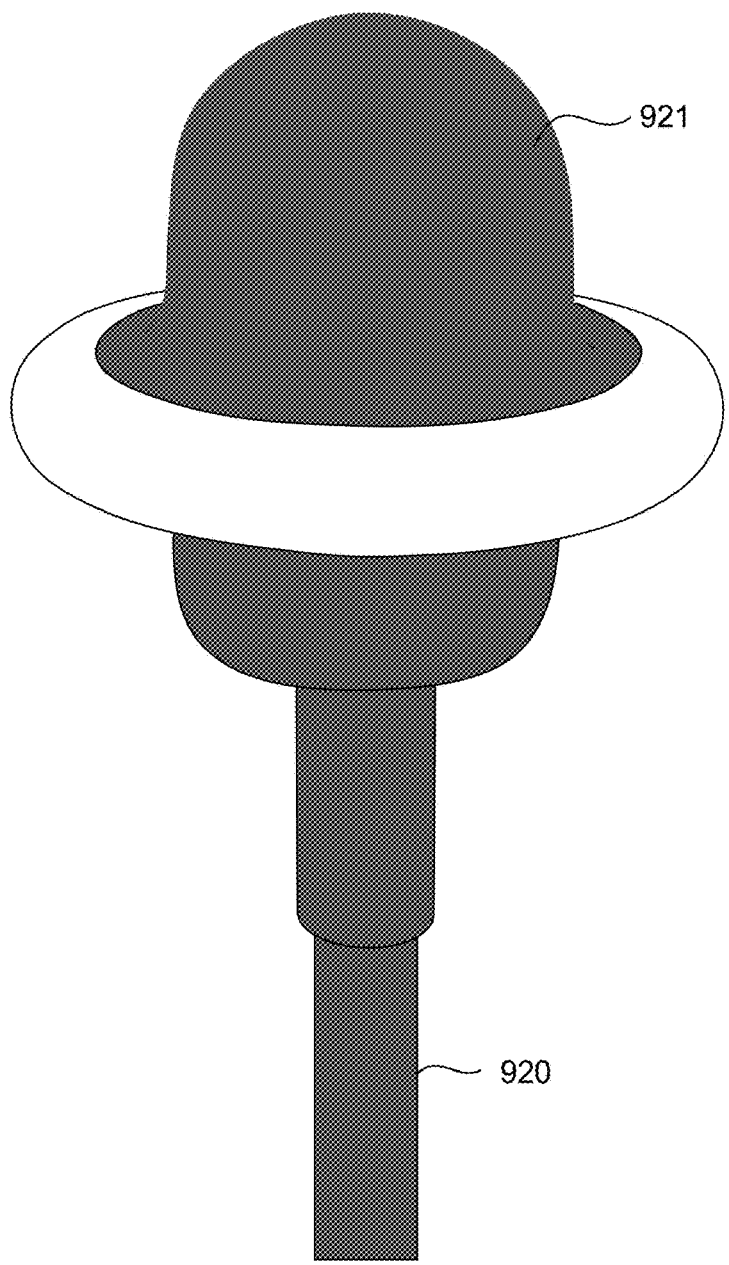
FIG. 16 shows an antenna portion of a base station according to an embodiment.
Figure 17:
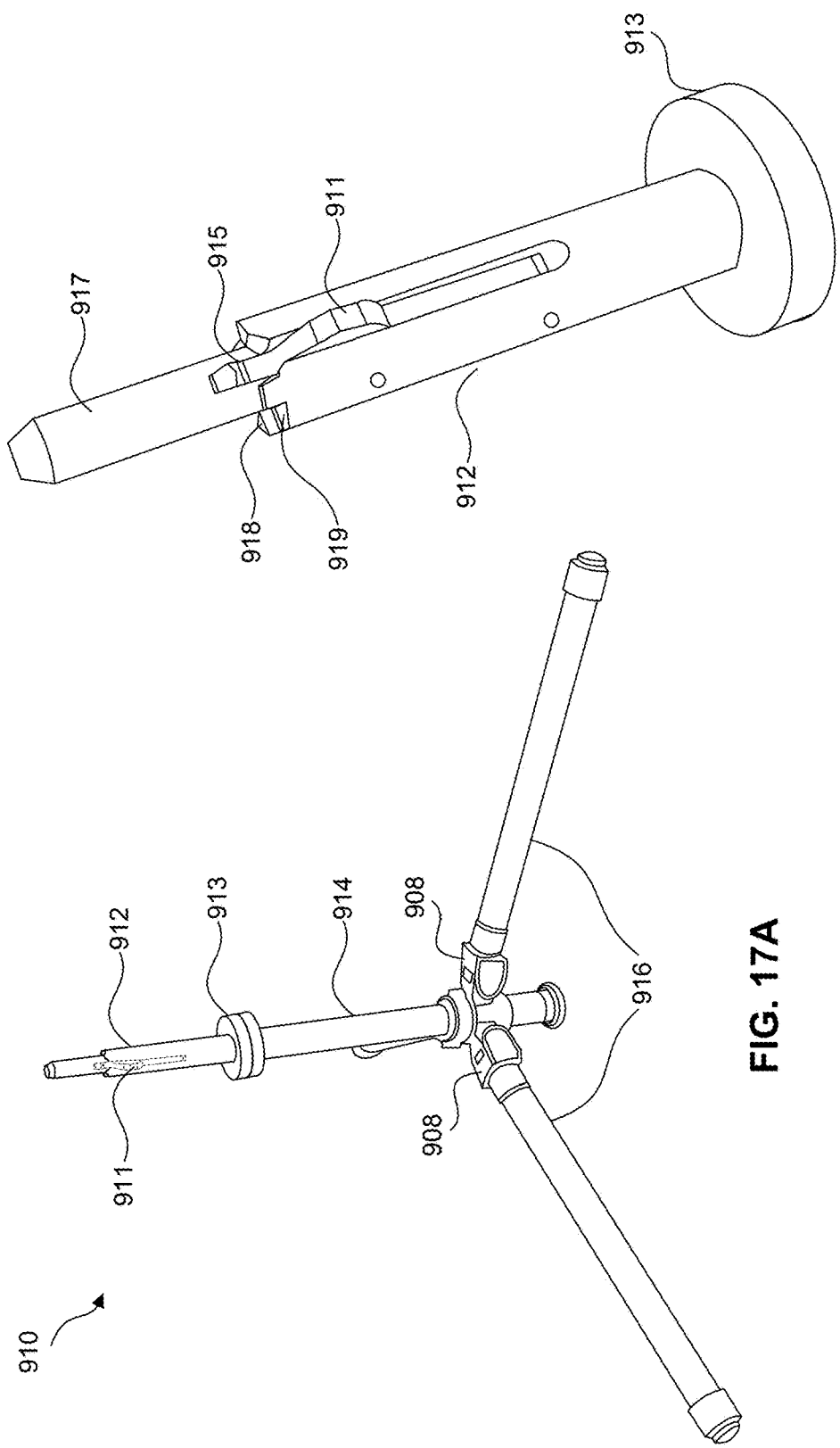
FIGS. 17A and 17B show a stand according to an embodiment.

FIGS. 14-26 show a base station system 900 according to an embodiment. Base station system 900 may be used in conjunction with other parts of group monitoring system 100 (e.g., individual monitors 300, object monitors 350, group monitoring device 400, etc.) discussed above. As shown in FIGS. 14-16, base station system 900 may include a base station 902, a stand 910 removably attached to base station 902 via a connector 912, and an antenna 920 removably attached to base station 902 via a connector 922. Connectors 912 and 922 may be any type of releasable fastening mechanism, including, but not limited to, luer-lock connectors, friction-fit connectors, threaded connectors, snap-fit connectors, or a combination thereof. As a non-limiting example, FIGS. 17A and 17B show a snap-fit type connector 912. As another non-limiting example, FIGS. 18 and 23-26 show a luer-lock type connector 922. Base station 902 may include a housing 930 for holding and protecting a control module (e.g., control module 1000). In one embodiment, one or both of stand 910 and antenna 920 may be fixed to base station 902.

Stand 910 may be removably attached to base station 902 adjacent to a base 970 of housing 930. In some embodiments, as shown in FIG. 14, stand 910 may include a tripod 914 having three legs 916 for supporting base station 902. Antenna 920 may be removably attached to housing 930 adjacent to a cover 940. In some embodiments, stand 910 and/or antenna 920 may be collapsible (e.g., designed to be foldable or telescopically extend from and retract into base station 902) and/or designed so as to be disassembled for ease of packing, storage, and transportation.

FIGS. 17A and 17B show a stand 910 having a connector 912 for removably attaching stand 910 to base station 902 according to one embodiment. Connector 912 may be removably coupled to tripod 914 via a coupling 913. Coupling 913 may include any type of releasable fastening mechanism, including, but not limited to, luer-lock connectors, friction-fit connectors, threaded connectors, snap-fit connectors, or a combination thereof. In some embodiments, connector 912 may be fixedly attached to tripod 914 at coupling 913 using, for example, welding or an adhesive. Legs 916 of tripod 914 may be foldable about hinges 908. As shown in FIG. 17B, connector 912 includes an actuator 911 for actuating a lock 915. Lock 915 may include a projection designed to snap-fit with a corresponding lock feature on base station 902 (e.g., a notch located near the bottom of a center passage 1058 in heat sink 1050). Actuator 911 may be any suitable type of manual actuator including, but not limited to, a button or a lever. Connector 912 also includes a shaft 917 sized and shaped to fit within center passage 1058 of heat sink 1050. In some embodiments, the base of shaft 917 may include a keyed surface having one or more projections 918 and one or more recesses 919. In such embodiments, projections 918 and recesses 919 serve to align base station 902 on connector 912 and help ensure that lock 915 securely engages the corresponding lock feature in center passage 1058. In such embodiments, a bottom surface 1059 of heat sink 1050 may include corresponding projections and recesses sized and shaped to mate with projections 918 and recesses 919.

During assembly, shaft 917 of connector 912 is inserted into the bottom of center passage 1058 to secure connector 912, and thereby stand 910, to base station 902 via engagement between lock 915 and the corresponding locking feature in center passage 1058. When a user wants to remove stand 910 from base station 902, the user manipulates actuator 911 so as to release lock 915 from the corresponding locking feature in center passage 1058 and removes connector 912 from the bottom of center passage 1058.

Figure 19:
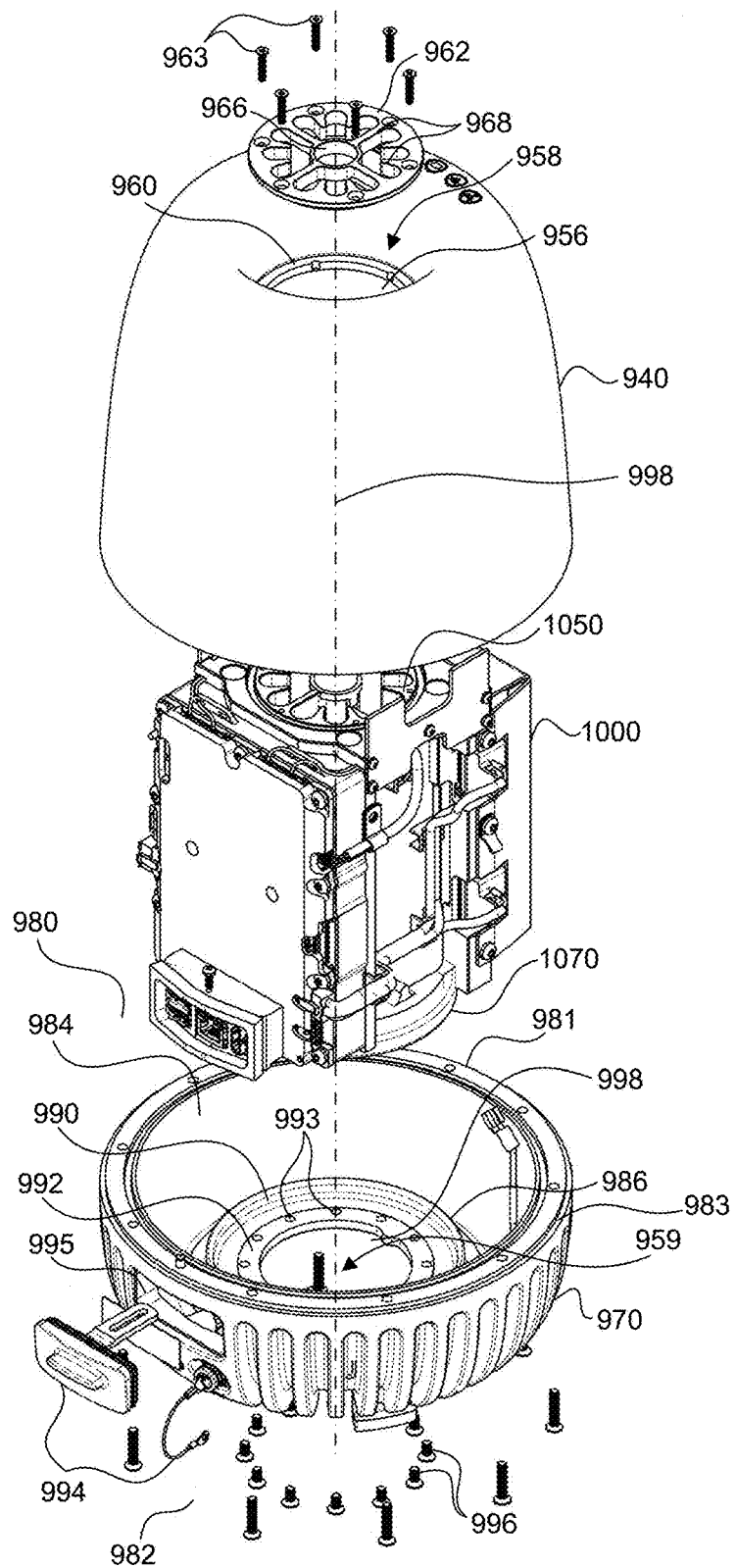
FIG. 19 shows an exploded view of a base station according to an embodiment.

Cover 940 and base 970 of housing 930 may be configured to releasably engage each other. In some embodiments, the engagement between cover 940 and base 970 is water resistant or waterproof. Such water resistance can be achieved by a close fit between a distal edge 947 of cover 940 and a proximal surface 981 of base 970, by use of a water resistant sealing compound, by use of sealing members, by other techniques, or by any combination thereof. In some embodiments, cover 940 and base 970 are permanently attached, via for example, molding, welding, an adhesive, or other suitable attachments. Together, cover 940 and base 970 define a hollow interior configured to receive a control module (e.g., control module 1000). Cover 940 and base 970 may also each define at least a part of a ventilation channel 956 that extends through housing 930. In some embodiments, ventilation channel 956 extends from a proximal end 944 of cover 940, through control module 1000, to a distal end 982 of base 970. For example, as shown in FIG. 19, cover 940 may define a top opening 958 of ventilation channel 956 and base 970 may define a bottom opening 959 of ventilation channel 956.

Figure 20:
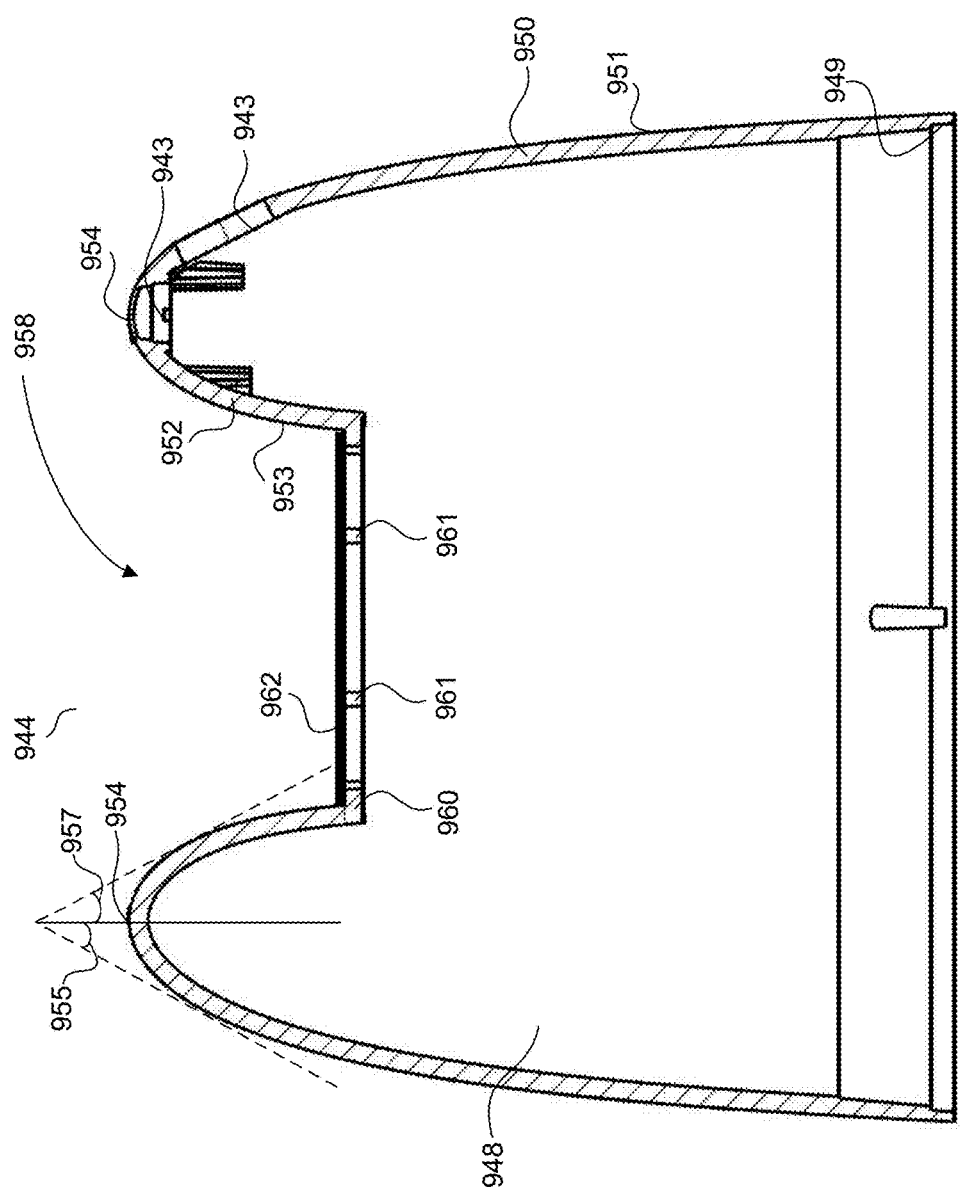
FIG. 20 shows a cross-sectional view of a base station cover according to an embodiment.

As shown in FIG. 20, top cover 940 may include an outer circumferential wall 950 defining an outer surface 951 of cover 940 and an inner circumferential wall 952 defining a ventilation channel surface 953 that defines at least a portion of ventilation channel 956. Outer circumferential wall 950 and inner circumferential wall 952 may define a hollow interior 948 configured to receive at least a portion of a control module (e.g., control module 1000). Top cover 940 may also include a circumferential peak 954 connecting inner circumferential wall 952 and outer circumferential wall 950. In one embodiment, circumferential peak 954 is the circumferential area(s) or point(s) on cover 940 that is (are) farthest from distal edge 947 located at distal end 946 of cover 940. In other words, circumferential peak 954 is the area(s) or point(s) on cover 940 that is (are) farthest from base 970 when cover 940 and base 970 are assembled. In some embodiments, circumferential peak 954 is a one-dimensional circumferential point (e.g., one-dimensional circle or oval) connecting outer circumferential wall 950 and inner circumferential wall 952. In some embodiments, circumferential peak 954 is a two-dimensional circumferential area (e.g., a two-dimensional circle or oval) connecting outer circumferential wall 950 and inner circumferential wall 952.

Figure 21:
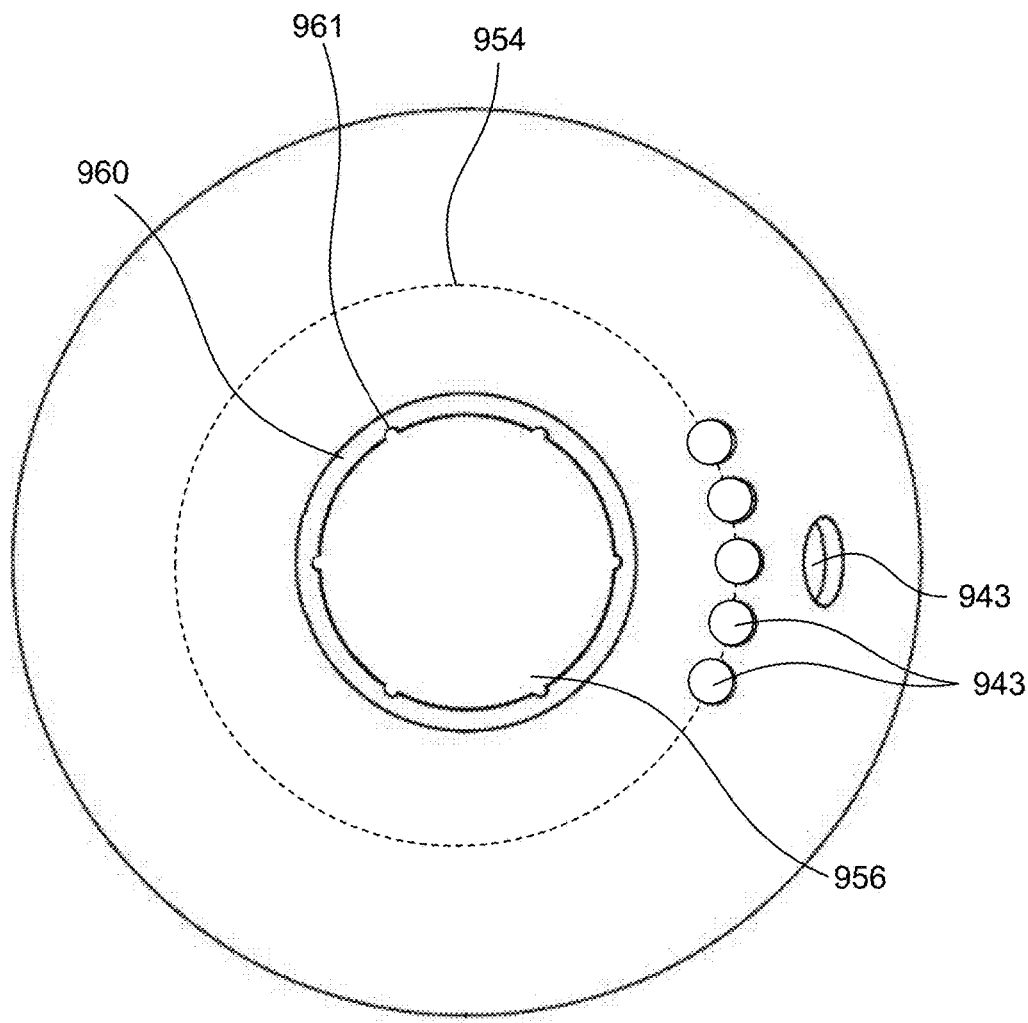
FIG. 21 shows a top view of a base station cover according to an embodiment.
Figure 22:
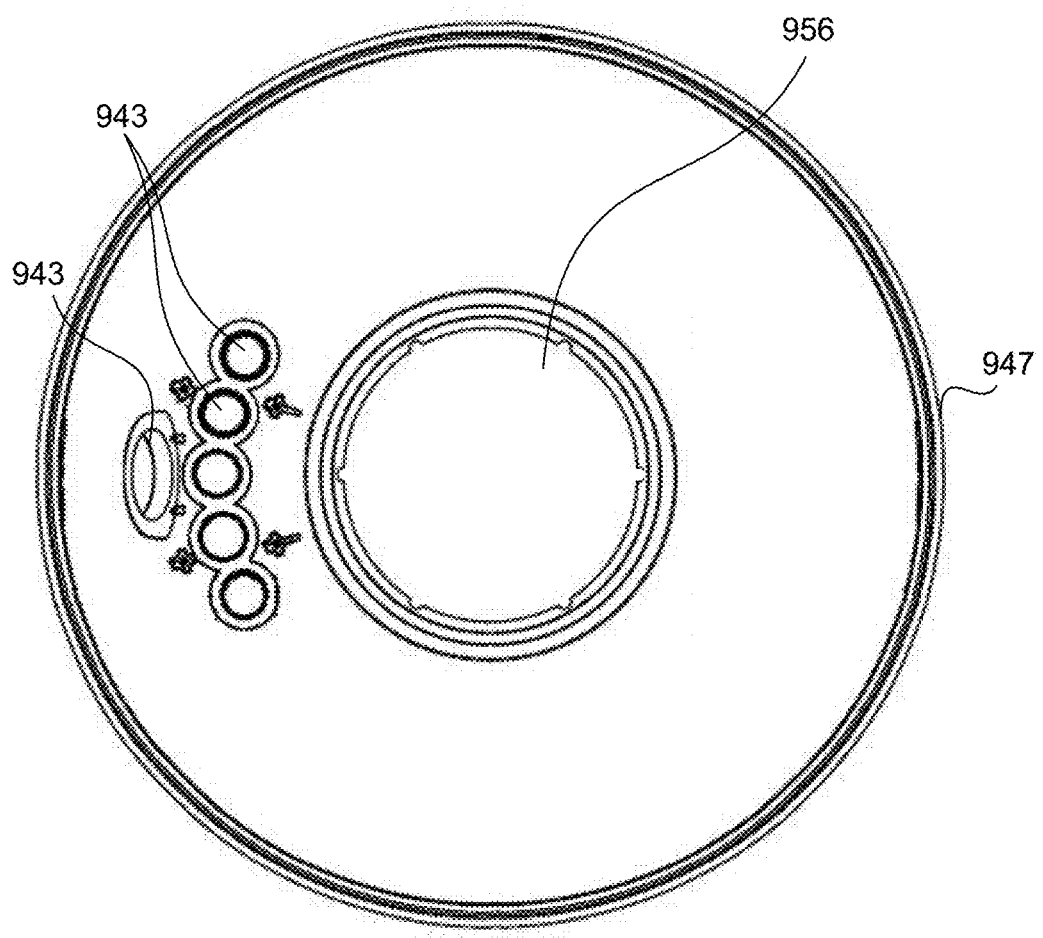
FIG. 22 shows a bottom view of a base station cover according to an embodiment.

An exemplary embodiment of cover 940 having a circumferential peak 954 that is a one-dimensional circumferential ring in shown in FIGS. 20-22. FIG. 21 is a top view of cover 940 in FIG. 20 with cap 962 removed. FIG. 22 is a bottom view of the cover 940 shown in FIG. 21. As shown in FIG. 20, outer circumferential wall 950 and inner circumferential wall 952 may form a circumferential arch at a proximal end 944 of cover 940. This arch shape results in outer circumferential wall 950 and inner circumferential wall 952 meeting at a one-dimensional circumferential peak 954. As shown in FIG. 21, this one-dimensional circumferential peak 954 has the shape of a one-dimensional ring. In some embodiments, outer circumferential wall 950 and inner circumferential wall 952 may meet to define an edge, the edge being a one-dimensional circumferential peak. As a non-limiting example, outer circumferential wall 950 and inner circumferential wall 952 may to define an upside-down "V" shape.

In some embodiments, outer circumferential wall 950 and inner circumferential wall 952 may not meet at a circumferential peak that has a one-dimensional circumferential point, but rather may be connected by a circumferential peak having a two-dimensional shape. In such embodiments, proximal end 944 of cover 940 may have a flat shape defining a circumferential area, such as, but not limited to, a two dimensional ring (i.e., a donut shape).

In some embodiments, circumferential peak 954 has a substantially continuous shape (e.g., a continuous ring or donut shape). In some embodiments, circumferential peak 954 has a non-continuous shape. In one embodiment, as shown in FIG. 21, circumferential peak 954 may include holes 943 for user input(s) 942 located at circumferential peak 954. In some embodiments, circumferential peak 954 may be discontinuous due to one or more recesses or indentations formed on cover 940 at a location corresponding to circumferential peak 954. As shown in FIGS. 19 and 20, circumferential peak 954 may define top opening 958 of ventilation channel 956.

In some embodiments, outer circumferential wall 950 includes a portion having a slope 955 in the range between 1° and 89° measured relative to circumferential peak 954 and in a direction orthogonal to top opening 958 of ventilation channel 956 (i.e., a direction parallel to or along a center axis 998 of ventilation channel 956). In some embodiments, slope 955 is in the range between 1° and 45°. In some embodiments, outer circumferential wall 950 has a non-constant slope 955 measured relative to the circumferential peak 954 and in a direction orthogonal to top opening 958 of ventilation channel 956. In some embodiments, outer circumferential wall 950 has a non-constant slope 955 measured relative to the circumferential peak 954 and in a direction orthogonal to top opening 958 of ventilation channel 956, where slope 955 is always between 1° and 89°. In some embodiments, slope 955 is always between 1° and 45°.

In some embodiments, inner circumferential wall 952 includes a portion having a slope 957 in the range between 1° and 89° measured relative to circumferential peak 954 and in a direction orthogonal to top opening 958 of ventilation channel 956. In some embodiments, slope 957 is in the range between 1° and 45°. In some embodiments, inner circumferential wall 952 has a non-constant slope 957 measured relative to circumferential peak 954 and in a direction orthogonal to top opening 958 of ventilation channel 956. In some embodiments, inner circumferential wall 952 has a non-constant slope 957 measured relative to circumferential peak 954 and in a direction orthogonal to top opening 958 of ventilation channel 956, where slope 957 is always between 1° and 89°. In some embodiments, slope 957 is always between 1° and 45°.

In some embodiments, both outer circumferential wall 950 and inner circumferential wall 952 include a portion having a slope 955/957 in the range between 1° and 89° measured relative to circumferential peak 954 and in a direction orthogonal to top opening 958 of ventilation channel 956. In some embodiments, both outer circumferential wall 950 and inner circumferential wall 952 include a portion having a slope 955/957 in the range between 1° and 45° measured relative to circumferential peak 954 and in a direction orthogonal to top opening 958 of ventilation channel 956. In some embodiments, both outer circumferential wall 950 and inner circumferential wall 952 have a non-constant slope 955/957 measured relative to circumferential peak 954 and in a direction orthogonal to top opening 958 of ventilation channel 956. In some embodiments, outer circumferential wall 950 and inner circumferential wall 952 both have a non-constant slope 955/957 measured relative to circumferential peak 954 and in a direction orthogonal to top opening 958 of ventilation channel 956, where slope 955/957 is always between 1° and 89°. In some embodiments, outer circumferential wall 950 and inner circumferential wall 952 both have a non-constant slope 955/957 measured relative to circumferential peak 954 and in a direction orthogonal to top opening 958 of ventilation channel 956, where slope 955/957 is always between 1° and 45°.

The shape of outer circumferential wall 950 may serve to reduce the impact force exerted on housing 930, for example, when housing 930 is hit by a stray sports object 40 or when housing 930 is dropped. The shape of outer circumferential wall 950 may also prevent water (e.g., rain water) from accumulating on housing 930. The shape of outer circumferential wall 950 may also create an aerodynamic housing 930. An aero dynamic housing 930 helps prevent base station 902 from being susceptible to high winds that could cause base station 902 to fall over.

The shape of inner circumferential wall 952 may serve to funnel water into ventilation channel 956. Funneling water into ventilation channel 956 may prevent water from accumulating on housing 930 and may allow water to quickly drain off housing 930 though ventilation channel 956.

In some embodiments, cover 940 is made of a ductile material with a low modulus of elasticity (i.e. a material that is capable of resisting plastic deformation and cracking when loaded). Such a material may act like a spring to absorb the force of an impact when housing 930 is dropped or hit by a sports object. In particular, the area of cover 940 around and including circumferential peak 954 may act like a spring to absorb energy when housing 930 is dropped or hit by a sports object.

Display 941 on cover 940 may include at least one user input 942 (e.g., buttons) to provide input capability to base station 202 may allow a user to control one or more functions of base station 902 (e.g., power on/off, a wireless signal reset, and a sync operation for syncing one or more monitors 300, 350, etc.). In some embodiments, user input(s) 942 may be located at proximal end 944 of cover 940. In some embodiments, user input(s) 942 may include indicator lights (e.g., light emitting diodes) for indicating a status (e.g., the quality of a wireless signal or an error status). For example, a green indicator light may represent a strong wireless signal (e.g., RF or GPS) strength, a yellow indicator light may represent a moderate wireless signal strength, and a red indicator light may indicate a poor wireless signal strength and/or no wireless signal. In some embodiments, a user input 942 may allow control module to enter "air plane mode," which may be required by an airline for safe air travel. In some embodiments, user input(s) 942 may be push-type buttons that are actuated by a user physically pushing the button. In some embodiments, user input(s) 942 may be capacitance sensors. A capacitive touch sensor may send a signal in response to sensing a touch, for example, the touch of a finger. In such embodiments, the water resistance of cover 940 may be improved because there may be less external connection points between cover 940 and user input(s) 942 that may be susceptible to water leaking though them. In some embodiments, display 941 may be displayed on an external device (e.g., may be included in display 404 of group monitoring device 400) that operatively couples to base station 902 (e.g., via a wireless connection such as Bluetooth® or a wired connection such as a USB cord).

As shown in FIGS. 19 and 20, cover 940 may include a flange 960 attached to inner circumferential wall 952 for holding a cap 962. Cap 962 may include holes 965 for receiving attachment members 963. Attachment members 963 may attach cap 962 to a heat sink 1050 disposed within ventilation channel 956. Attachment members 963 may be removable attachment members (e.g., screws) or may be more permanent attachment members (e.g., rivets). In some embodiments, cap 962 may be alternatively or additionally attached to heat sink 1050 via molding, welding, an adhesive, or other suitable attachments.

When secured to heat sink 1050, cap 962 may serve to firmly secure cover 940 to a top surface 1051 of heat sink 1050. Specifically, cap 962 may serve to firmly secure flange 960 to top surface 1051 of heat sink 1050, thereby creating a water resistant seal between flange 960 and top surface 1051. In some embodiments, top surface 1051 of heat sink 1050 may include a groove 1053 for holding a seal 1054 (e.g., O-ring) for creating a water resistant seal between flange 960 and top surface 1051. The sealed engagement between cap 962 and top surface 1051 of heat sink 1050 prevents water from contacting control module 1000 disposed within housing 930. In some embodiments, seal 1054 may be composed of a flexible or elastic material to help absorb the force of an impact (e.g., when housing 930 is dropped) and protect control module 1000 from damage. In some embodiments, flange 960 may include a seal (e.g., O-ring) for sealing with top surface 1051 of heat sink 1050. In some embodiments, flange 960 may include drainage apertures 961 for allowing water to drain through flange 960 and into ventilation channel 956.

Cap 962 may include the same or a similar cross-sectional shape as heat sink 1050. Cap 962 may include a center aperture 966 and a plurality of fins 968. Cap 962 may also be made of the same or similar material as heat sink 1050. For example, cap 962 may be made of aluminum, aluminum alloys, copper, or copper alloys. A cap 962 made of a heat sink material may facilitate the transfer of heat from heat sink 1050 to the atmosphere.

Figure 18:
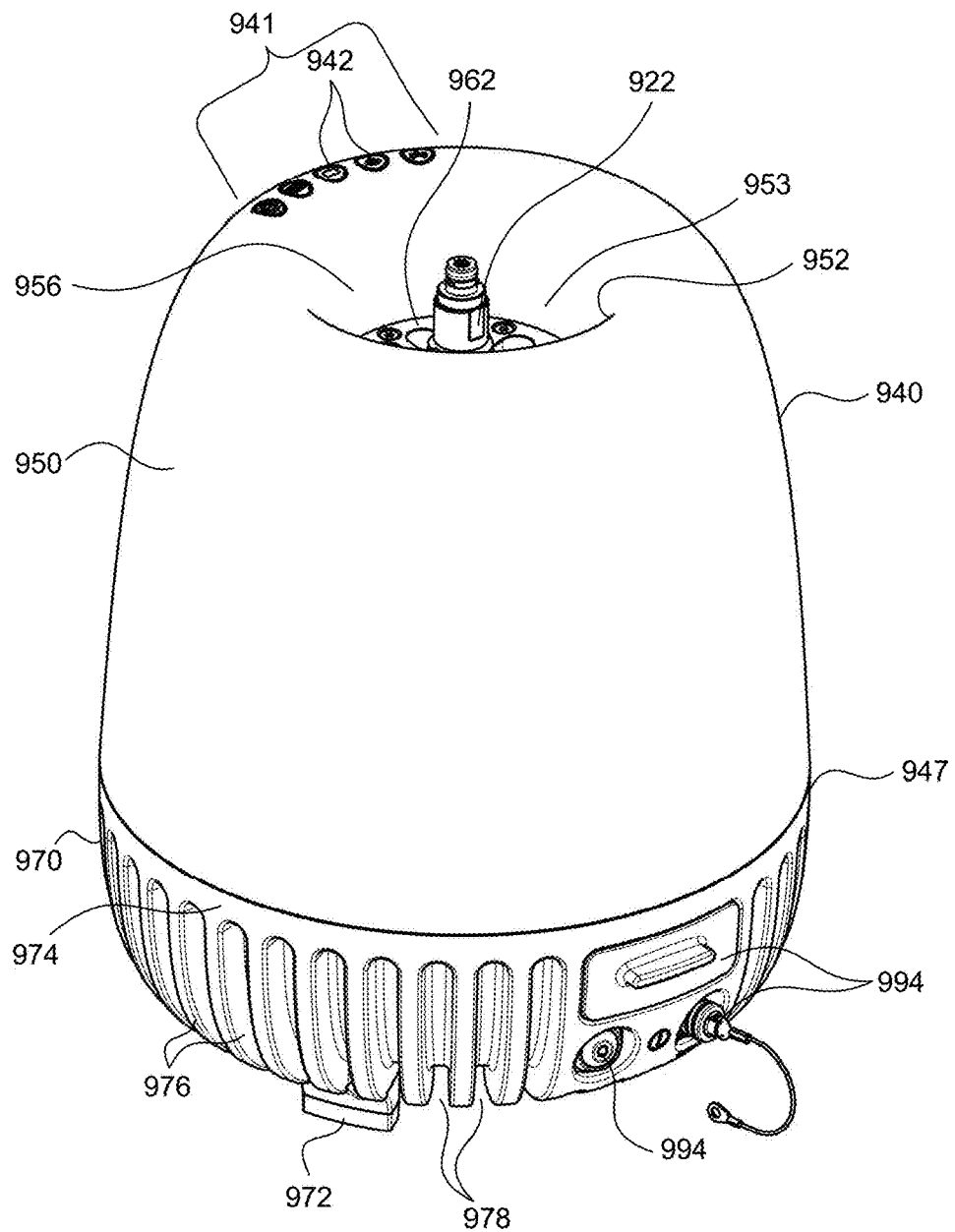
FIG. 18 shows a perspective view of a base station according to an embodiment.

As shown, for example, in FIGS. 18 and 19, housing 930 also includes a base 970. Base 970 includes a proximal end 980 that engages distal edge 947 when cover 940 and base 970 are assembled. Proximal end 980 of base may include a proximal surface 981 including a radial recess 983 configured to engage a distal recess 949 on distal edge 947. The engagement between radial recess 983 and distal recess 949 may help to create a water resistant seal between base 970 and cover 940. Base 970 also includes a distal end 982 defining bottom opening 959 of ventilation channel 956. Distal end 982 of base 970 may also include a plurality of supports 972 for attaching base station 902 to a support structure. In some embodiments, supports 972 may include attachment members (e.g., clamps, screws, bolts, etc.) for securing base station 902 to a table, a wall, a rack, a mounting device, a cart, etc. In some embodiments, supports 972 may be feet configured to hold base station 202 upright and above a surface (e.g., a table top or the ground). Preferably, the feet have a minimum height of 1.5 cm to allow sufficient air flow and/or heat transfer through heat sink 1050 when base station 902 is placed on a table or other surface during use.

As shown in FIG. 19, base 970 may include fins 976 protruding from an outer wall 974. Together, outer wall 974 of base 970 and outer circumferential wall 950 of cover 940 may define the outer surface of base station 902. In some embodiments, as shown in FIG. 18, outer wall 974 and outer circumferential wall 950 may, together, form a base station having an egg-shape. Fins 976 may be disposed adjacent to proximal end 980 and wrap around distal end 982 of base 970 towards bottom opening 959 of ventilation channel 956 (see e.g., FIG. 15). Individual fins 976 may be separated by voids 978.

In some embodiments, the configuration of fins 976 and voids 978 on base 970 allow base 970 to function as a heat sink. In such embodiments, base 970 may be made of a heat sink material, such as, but not limited to, aluminum, aluminum alloys, copper, or copper alloys. Also in such embodiments, base 970 may be thermally coupled to heat sink 1050. In other words, base 970 may form part of heat sink 1050. A base 970 that forms part of heat sink 1050 may increase the cooling efficiency of heat sink 1050 because more surface area of heat sink 1050 (i.e., the surface area of outer wall 974 having fins 976) is exposed to the atmosphere. This creates a larger surface area for heat exchange between heat sink 1050 and the atmosphere, thereby increasing the rate of convective heat transfer from heat sink 1050 to the atmosphere.

Base 970 may include a hollow interior 984 configured to receive at least a portion of a control module (e.g., control module 1000). Hollow interior 948 may include an interior skirt 986 configured to receive at least a portion of a bottom rim 1070 of control module 1000. In embodiments where base 970 forms a part of heat sink 1050, the attachment between interior skirt 986 and bottom rim 1070 thermally couples base 970 to heat sink 1050. Skirt 986 may include a skirt wall 990 and a lip 992 configured to receive bottom rim 1070. Skirt 986 may also include a through hole 988 that defines bottom opening 959 of ventilation channel 956 when base station 902 is assembled. In some embodiments, lip 992 may include a plurality of holes 993 for receiving attachment members 996 used to secure base 970 to bottom rim 1070 of control module 1000. Holes 993 be sized and spaced to mate with holes 1081 on bottom rim 1070 so as to receive attachment members 996. In some embodiments, a bottom surface 1076 of bottom rim 1070 may include a sealing member 1077 (e.g., an O-ring) for creating a water resistant seal between interior skirt 986 and bottom rim 1070. In some embodiments, base 970 may be permanently fixed to bottom rim 1070 using, for example, molding, welding, an adhesive, or other suitable attachments.

Bottom rim 1070 may be composed of a material having good thermal conductivity to help conduct heat from heat sink 1050 into the atmosphere surrounding base station 202. In some embodiments, bottom rim 1070 is made of an elastic material that has a thermal conductivity greater than or equal to 3.0 W/mK, such as, but not limited to, Thermally Conductive Elastomer CoolPoly® E8101 (thermal conductivity 12 W/mK, Shore 80) manufactured by Cool Polymers®, Inc. An elastic bottom rim helps absorb the force of an impact (e.g., when housing 930 is dropped) to protect control module 1000 from damage.

As shown in FIGS. 23-26, bottom rim 1070 attaches to bottom surface 1059 of heat sink 1050. In some embodiments, bottom rim 1070 may include a sealing surface 1072 having a gasket 1074 for creating a water resistant seal with bottom surface 1059 of heat sink 1050. Gasket 1074 helps prevent water draining through ventilation channel 956 from contacting electrical components of control module 1000 or other sensitive components. Bottom rim 1070 may also include a flange 1078 having holes 1080 for receiving attachment members 1082 (e.g., screws) for securing bottom rim 1070 to bottom surface 1059 of heat sink 1050. In some embodiments, bottom rim 1070 may be permanently fixed to bottom surface 1059 using, for example, molding, welding, an adhesive, or other suitable attachments. In some embodiments, bottom rim 1070 may be an integral part of heat sink 1050. Bottom rim 1070 also includes an opening 1084 that forms part of ventilation channel 956 when bottom rim 1070 is assembled on heat sink 1050.

Base 970 may also include one or more slots 995 for allowing access to electrical ports 1004 (e.g., USB ports, power outlets, etc.) associated with an outlet 1002 of control module 1000. In some embodiments, base 970 may include plugs 994 for releasably sealing slots 995 and preventing water from entering housing 930 and contacting ports 1004. Ports 1004 may be recessed from outer surface 974 of base 970 and covered with plugs 994 to decrease the possibility of water damage to ports 1004.

Figure 23:
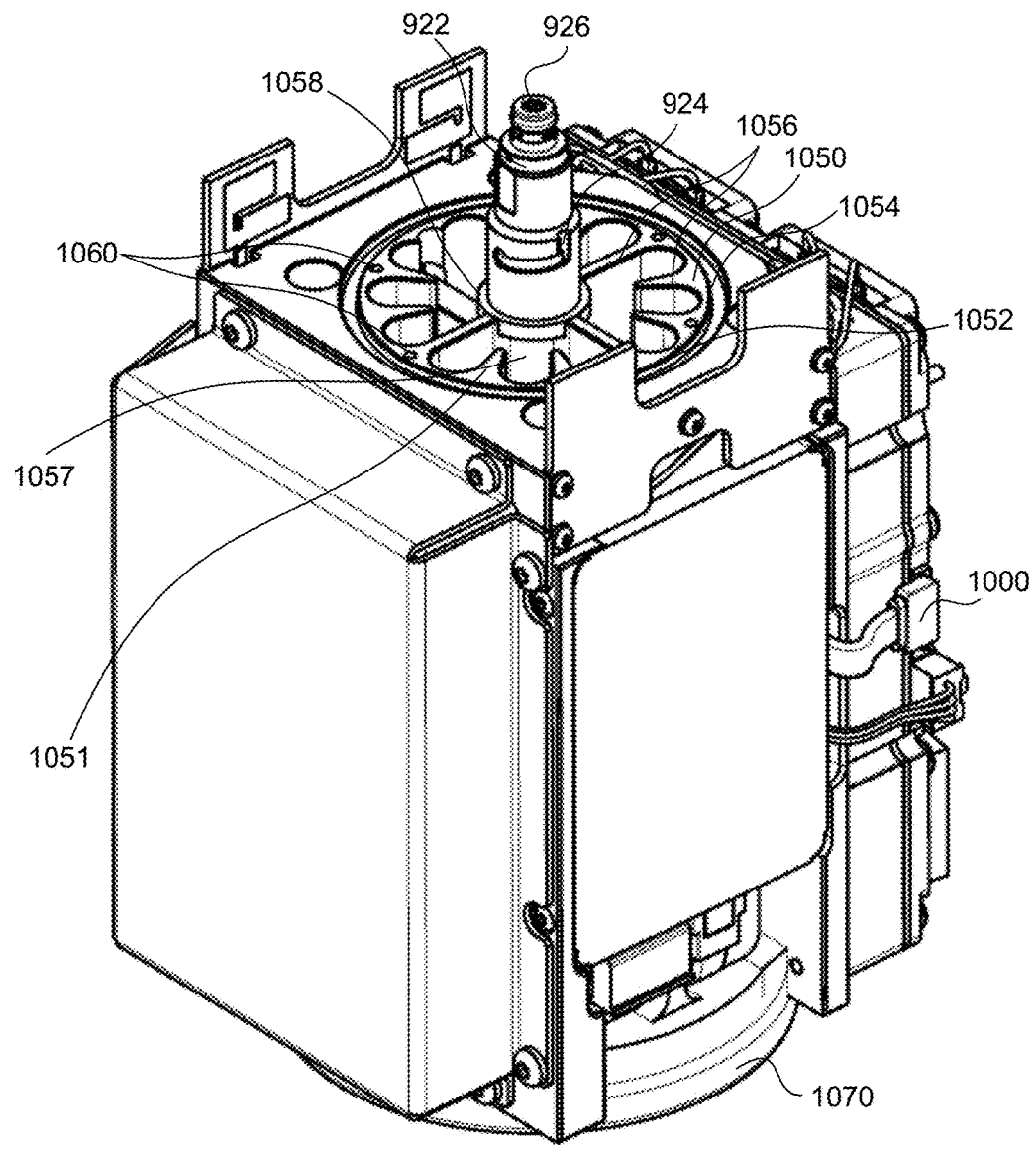
FIG. 23 shows a first perspective view of a control module according to an embodiment.
Figure 24:
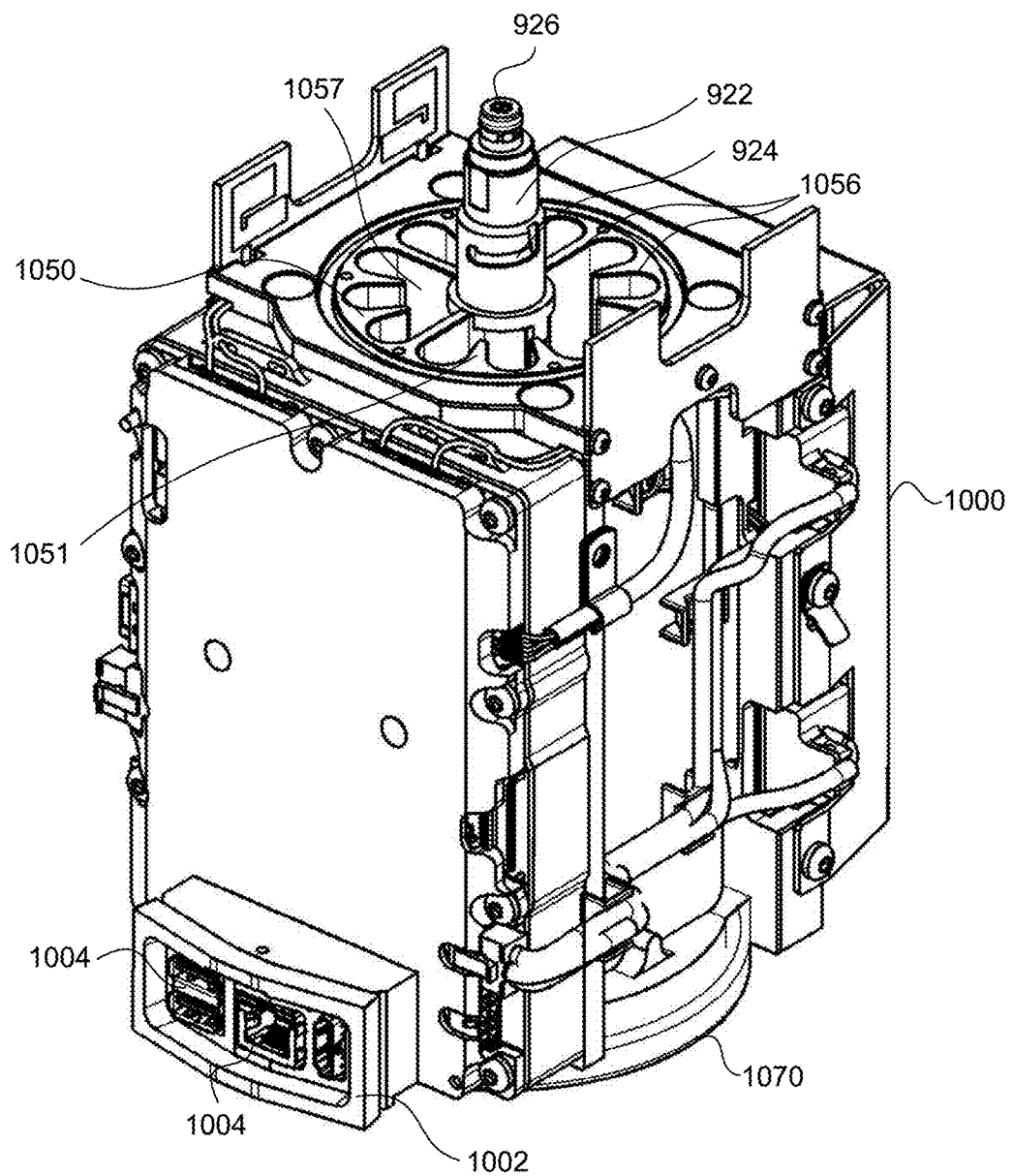
FIG. 24 shows a second perspective view of a control module according to an embodiment.

As shown, for example, in FIG. 23, heat sink 1050 may be disposed within control module 1000. Heat sink 1050 includes top surface 1051 and a side wall 1052. A plurality of fins 1056 may extend from side wall 1052 towards a center passage 1058 formed within heat sink 1050. At least one fin 1056 may extend from side wall 1052 to center passage 1058. Side wall 1052 of heat sink 1050 may be in direct contact with control module 1000. In some embodiments, heat sink 1050 may be integrally formed with control module 1000. In other words, side wall 1052 of heat sink may be an integral part of control module 1000. In some embodiments, heat sink 1050 may be an insert removably disposed within control module 1000. In such embodiments, side wall 1052 may be sized and shaped to mate with an internal wall of control module 1000.

In some embodiments, fins 1056 may be radially disposed about center axis 998 of ventilation channel 956. Fins 1056 along with center passage 1058 define a heat exchange surface 1057, which is exposed to the atmosphere and defines a portion of an interior surface of ventilation channel 956. Center passage 1058 may extend from top surface 1051 of heat sink 1050 to a bottom surface 1059 of heat sink 1050. The portion of center passage 1058 located adjacent to top surface 1051 may be configured to receive connector 922 for attaching antenna 920. The portion of center passage 1058 located adjacent to bottom surface 1059 of heat sink 1050 may be configured to receive a portion of connector 912 (e.g., shaft 917) for attaching stand 910. In some embodiments, center passage 1058 may not extend from top surface 1051 to bottom surface 1059, but rather may be a discontinuous passage having apertures located at both ends for receiving connectors 912 and 922.

Figure 25:
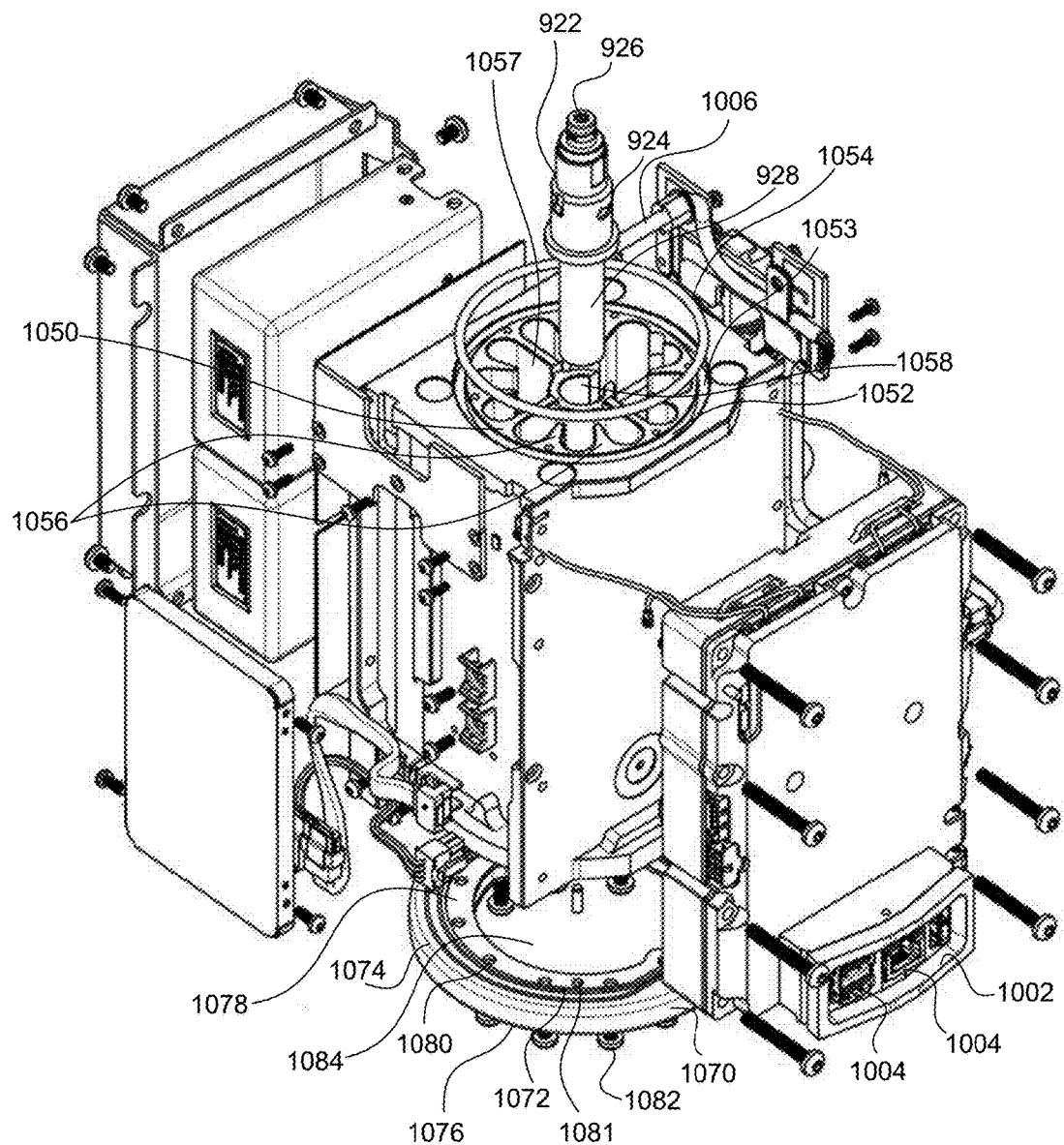
FIG. 25 shows a first exploded view of a control module according to an embodiment.
Figure 26:
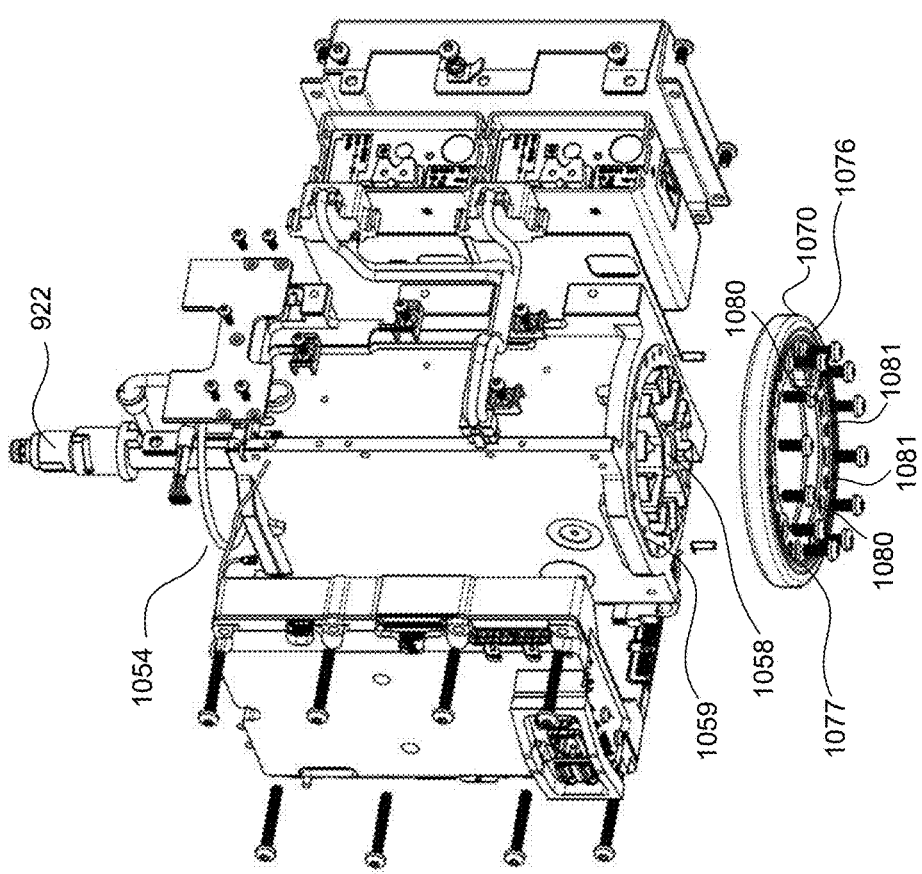
FIG. 26 shows a second exploded view of a control module according to an embodiment.

As shown in FIG. 25, connector 922 may include a shaft 928 sized and shaped to fit within center passage 1058. In some embodiments, shaft 928 may permanently fixed within center passage 1058 using, for example, molding, welding, an adhesive, or other suitable attachments. In some embodiments, shaft 928 may be removable from center passage 1058. Shaft 928 may have an attachment member 924 (e.g., luer-lock connector) attached thereto for removably attaching to a corresponding attachment member located on antenna 920. Attachment member 924 may also include an electrical coupling 926 that electrically couples control module 1000 to transceiver 921 when antenna 920 to attached, such that a signal can be transmitted to and/or received from external devices (e.g., individual monitors 300 or object monitors 350). Connector 922 may also be coupled to a cord 1006 for electrically coupling control module 1000 to transceiver 921, via electrical coupling 926. Electrical coupling 926 removes the need for external antenna wires extending to transceiver 921 which may become tangled and may be aesthetically unappealing. As shown in FIG. 16, transceiver 921 may be devoid of any outside cables, sockets, or antennas. Removing these outside components reduces possible points of breakage and reduces the possibility of damage to components of transceiver 921. In some embodiments, antenna 920 and/or transceiver 921 may be designed for indoor use.

In some embodiments, the modularity of one or more of the components of base station 902 described herein (e.g., cover 940, base 970, cap 962, etc.) may allow for various components to be easily replaced in the event that one of them becomes damaged. Additionally, it may facilitate the replacement of components, including electrical components of a control module (e.g., control module 1000) or the control module itself, in the event that a new model or version is developed. In some embodiments, the permanent attachment (e.g., via molding, adhesive, welding, or other suitable attachments) of one or more components of base station 902 may increase the robustness and/or water resistance of base station 902.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A device for monitoring a plurality of individuals, the device comprising:
    a base station in communication with a plurality of sensors worn by the plurality of individuals during a fitness activity, the base station comprising:
        a housing comprising:
            a top central opening located at a proximal end of the housing,
            a bottom central opening located at a distal end of the housing,
            a ventilation channel comprising a ventilation channel wall defining the top central opening, the bottom central opening, and a through hole extending through the housing between the top central opening and the bottom central opening, and
            a sloped circumferential wall located at the proximal end of the housing and configured to funnel water into the top central opening and through the ventilation channel;
        a control module disposed within the housing around an outer surface of the ventilation channel wall and configured to monitor the plurality of individuals; and
        a heat sink disposed within the ventilation channel.
2. The device of claim 1, wherein the heat sink comprises a plurality of fins.
3. The device of claim 2, wherein the fins are disposed radially about a center of the ventilation channel.
4. The device of claim 2, wherein the fins are coupled to an inner surface of the ventilation channel wall and extend towards a center of the ventilation channel.
5. The device of claim 1, wherein the heat sink is in direct contact with the control module.
6. The device of claim 1, wherein a portion of the ventilation channel wall is defined by a wall of the control module.
7. The device of claim 1, wherein the heat sink defines a central aperture configured to receive at least one of: a portion of a stand and a portion of an antenna.
8. The device of claim 7, wherein the antenna comprises a first connector and the stand comprises a second connector; and
    wherein the central aperture is configured to removably receive a portion of the first connector and the second connector.
9. The device of claim 1, wherein the heat sink comprises a first part and a second part;
    wherein the first part is disposed within the ventilation channel; and
    wherein the second part defines a portion of an outer surface of the housing.
10. The device of claim 9, wherein the first part is thermally coupled to the second part.
11. The device of claim 1, wherein the housing comprises a cover and a base; and
    wherein the cover and the base define a portion of the ventilation channel.
12. The device of claim 11, wherein the control module is disposed between the cover and the base.
13. The device of claim 11, wherein the cover and the base are removably attached.
14. The device of claim 1, further comprising an antenna.
15. The device of claim 14, wherein in the antenna is removably attached to the base station.
16. The device of claim 1, further comprising a stand.
17. The device of claim 16, wherein the stand is removably attached to the base station.
18. A monitoring system for monitoring a plurality of individuals, comprising:
    a plurality of individual sensors worn by the plurality of individuals during a fitness activity;
    a base station, the base station comprising:
        a housing comprising:
            a top central opening located at a proximal end of the housing,
            a bottom central opening located at a distal end of the housing,
            a ventilation channel comprising a ventilation channel wall defining the top central opening, the bottom central opening, and a through hole extending through the housing between the top central opening and the bottom central opening, and
            a sloped circumferential wall located at the proximal end of the housing and configured to funnel water into the top central opening and through the ventilation channel;
        a control module disposed within the housing around an outer surface of the ventilation channel wall, the control module configured to monitor the plurality of individuals by receiving information from and transmitting information to the plurality of individual sensors; and
        a heat sink disposed within the ventilation channel.
19. A base station for monitoring a plurality of individuals, the base station comprising:
    a housing comprising a cover coupled to a base, the cover comprising:
        an inner circumferential wall, an outer circumferential wall, and a circumferential peak connecting the inner circumferential wall and the outer circumferential wall;
        wherein the inner circumferential wall, the outer circumferential wall, and the circumferential peak define a hollow interior therebetween, the hollow interior being sealed so as to be water resistant;
        wherein the inner circumferential wall defines at least a portion of a ventilation channel; and wherein the circumferential peak defines a top opening of the ventilation channel;
a control module disposed within the hollow interior of the housing and configured to monitor the plurality of individuals by receiving information from one or more sensors worn by the plurality of individuals; and
a heat sink disposed within the ventilation channel.

20. The base station of claim 19, wherein at least a portion of the inner circumferential wall and the outer circumferential wall have a slope in the range between 1° and 89° measured relative to the circumferential peak and in a direction orthogonal to the top opening of the ventilation channel.

21. The base station of claim 19, wherein at least a portion of the inner circumferential wall and the outer circumferential wall have a slope in the range between 1° and 45° measured relative to the circumferential peak and in a direction orthogonal to the top opening of the ventilation channel.

22. The base station of claim 19, wherein the inner circumferential wall has a non-constant slope measured relative to the circumferential peak and in a direction orthogonal to the top opening of the ventilation channel.

23. The base station of claim 19, wherein the outer circumferential wall has a non-constant slope measured relative to the circumferential peak and in a direction orthogonal to the top opening of the ventilation channel.

24. The base station of claim 19, wherein the base station is portable.

25. The base station of claim 19, wherein the housing is water resistant.

26. The base station of claim 19, wherein the heat sink comprises a first part and a second part;
wherein the first part is disposed within the ventilation channel; and
wherein the second part defines a portion of the base of the housing.

27. The base station of claim 26, wherein the second part is the base of the housing.

28. The base station of claim 19, wherein the housing has an egg-shape.

29. The base station of claim 19, wherein the cover is removably coupled to the base.

30. The base station of claim 19, wherein the ventilation channel is a through hole extending from a proximal end of the housing to a distal end of the housing to allow the ventilation of air through the housing.

31. The base station of claim 19, wherein the ventilation channel comprises the top opening located at a proximal end of the housing and a bottom opening located a distal end of the housing; and
wherein the ventilation channel extends from the proximal end of the housing, through the control module, to the distal end of the housing.

32. A device for monitoring a plurality of individuals, the device comprising:
a base station in communication with a plurality of sensors worn by the plurality of individuals during a fitness activity, the base station comprising:
a housing having a ventilation channel extending through the housing;
a control module disposed within the housing and configured to monitor the plurality of individuals; and
a heat sink disposed within the ventilation channel,
wherein the heat sink defines a central aperture configured to receive at least one of a portion of a stand and a portion of an antenna, wherein the antenna comprises a first connector and the stand comprises a second connector; and wherein the central aperture is configured to removably receive a portion of the first connector and the second connector.

33. The device of claim 1, wherein the top central opening and the bottom central opening are defined by an outermost surface of the base station.

* * * * *